(12) United States Patent
Burdette

(10) Patent No.: US 12,235,533 B2
(45) Date of Patent: Feb. 25, 2025

(54) PERIMETER ADHESIVE FOR IMPROVED RELIABILITY AND REDUCED STRESS MURA IN CURVED DISPLAYS WITH COVER GLASS

(71) Applicant: Corning Incorporated, Corning, NY (US)

(72) Inventor: Steven Roy Burdette, Big Flats, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 17/766,630

(22) PCT Filed: Sep. 23, 2020

(86) PCT No.: PCT/US2020/052136
§ 371 (c)(1),
(2) Date: Apr. 5, 2022

(87) PCT Pub. No.: WO2021/076280
PCT Pub. Date: Apr. 22, 2021

(65) Prior Publication Data
US 2024/0053629 A1 Feb. 15, 2024

Related U.S. Application Data

(60) Provisional application No. 62/916,660, filed on Oct. 17, 2019.

(51) Int. Cl.
*G02F 1/1333* (2006.01)
*B60K 35/60* (2024.01)
(Continued)

(52) U.S. Cl.
CPC ........ *G02F 1/133331* (2021.01); *B60K 35/60* (2024.01); *G02F 1/133528* (2013.01);
(Continued)

(58) Field of Classification Search
CPC .................................................. G02F 1/133305
See application file for complete search history.

(56) References Cited

U.S. PATENT DOCUMENTS

| 10,254,588 B2 | 4/2019 | Zhao et al. |
| 10,394,066 B1 * | 8/2019 | Yamamoto ............ G02F 1/1339 |

(Continued)

FOREIGN PATENT DOCUMENTS

| CN | 107743443 A | 2/2018 |
| CN | 108328940 A | 7/2018 |

(Continued)

OTHER PUBLICATIONS

International Search Report and Written Opinion of the International Searching Authority; PCT/US2020/052136; mailed on Dec. 11, 2020; 12 pages; European Patent Office.

(Continued)

*Primary Examiner* — Mariam Qureshi

(57) ABSTRACT

Embodiments of a curved display assembly are disclosed. The assembly includes a glass sheet having first and second major surfaces. The second major surface defines a first curvature of the glass sheet, and the first curvature has a bend axis. The assembly also includes a curved display having a second thickness between first and second display surfaces. The display has a display region and two overhanging edges adjacent to the display region and parallel to the bend axis. A first adhesive bonds the second display surface to the second major surface in the display region. A second adhesive is disposed between each of the two overhanging edges and the second major surface. The second adhesive has a higher elastic modulus than the first adhesive. The overhanging edges each extend a distance outside of the display area that is at least three times the second thickness of the curved display.

17 Claims, 9 Drawing Sheets

(51) Int. Cl.
  G02F 1/1335   (2006.01)
  H10K 59/80    (2023.01)
  B60K 35/22    (2024.01)

(52) U.S. Cl.
  CPC ..... H10K 59/8722 (2023.02); H10K 59/8793 (2023.02); B60K 35/22 (2024.01)

(56) References Cited

U.S. PATENT DOCUMENTS

| | | | | |
|---|---|---|---|---|
| 2012/0020056 | A1* | 1/2012 | Yamagata | G09F 9/33 |
| | | | | 361/679.01 |
| 2015/0210589 | A1 | 7/2015 | Chang et al. | |
| 2015/0210590 | A1* | 7/2015 | Chang | B32B 17/10009 |
| | | | | 428/220 |
| 2015/0277131 | A1 | 10/2015 | Park et al. | |
| 2017/0003536 | A1 | 1/2017 | Chen et al. | |
| 2017/0299906 | A1* | 10/2017 | Zhao | G02F 1/133528 |
| 2018/0004039 | A1* | 1/2018 | Kim | G02B 6/0025 |
| 2018/0210489 | A1* | 7/2018 | Boisard | G02B 1/14 |
| 2018/0215125 | A1* | 8/2018 | Gahagan | B32B 17/1077 |
| 2022/0204382 | A1* | 6/2022 | Meister | C03B 23/0357 |

FOREIGN PATENT DOCUMENTS

| | | |
|---|---|---|
| CN | 213877433 U | 8/2021 |
| JP | 2013-188993 A | 9/2013 |
| WO | 2019/010401 A1 | 1/2019 |

OTHER PUBLICATIONS

You et al; "Light Leakage Study of the Curved ADS Mode LCDs", 2015, vol. 42.3, pp. 637-640.
Chinese Patent Application No. 202080076755.3, Office Action dated Mar. 8, 2024, 4 pages (English Translation only), Chinese Patent Office.

* cited by examiner

PERIMETER ADHESIVE FOR IMPROVED RELIABILITY AND REDUCED STRESS MURA IN CURVED DISPLAYS WITH COVER GLASS

CROSS-REFERENCE TO RELATED APPLICATIONS

This application claims the benefit of priority under 35 U.S.C. § 371 of International Application No. PCT/US2020/052136, filed on Sep. 23, 2020, which claims the benefit of priority under 35 U.S.C. § 119 of U.S. Provisional Application Ser. No. 62/916,660 filed on Oct. 17, 2019, the content of each of which is relied upon and incorporated herein by reference in its entirety.

BACKGROUND

The disclosure relates to curved display assemblies including glass and methods for forming the same, and more particularly to curved display assemblies having reduced stress mura associated with bending a display and methods for forming the same.

Vehicle interiors, appliances, and consumer electronics include curved surfaces and can incorporate displays in such curved surfaces. The materials used to form such curved surfaces are typically limited to polymers, which do not exhibit the durability and optical performance as glass. As such, curved glass sheets are desirable, especially when used as covers for displays. Existing methods of forming such curved display assemblies have drawbacks including optical defects associated with light leakage from backlit displays. Accordingly, Applicant has identified a need for curved display assemblies that can incorporate a curved glass sheet and curved display that does not experience the problems of light leakage.

SUMMARY

According to an aspect, embodiments of the disclosure relate to a curved display assembly. The curved display assembly includes a glass sheet having a first major surface and a second major surface opposite to the first major surface. The glass sheet has a first thickness measured between the first major surface and the second major surface. The second major surface defines a first radius of curvature of the glass sheet, and the first radius of curvature has a bend axis. The curved display assembly also includes a curved display having a second thickness between a first display surface and a second display surface. The display has a display region and two overhanging edges that are adjacent to the display region and parallel to the bend axis. The curved display assembly includes a first adhesive bonding the second display surface of the curved display to the second major surface of the glass sheet in the display region. The curved display assembly further includes a second adhesive bonding the two overhanging edges to the second major surface of the glass sheet. The second adhesive has a higher elastic modulus than the first adhesive. The overhanging edges each extend a distance outside of the display area that is at least three times the second thickness of the curved display.

According to another aspect, embodiments of the disclosure relate to a method of forming a curved display assembly. In the method, a glass sheet having a first major surface and a second major surface is provided. The second major surface is opposite to the first major surface. A display is bonded to the second major surface of the glass sheet. The display includes a display region and two overhanging edges adjacent to the display region. The display region is bonded to the second major surface of the glass sheet using a first adhesive, and the two overhanging edges are bonded to the second major surface of the glass sheet using a second adhesive. The second adhesive has a higher modulus than the first adhesive. Also in the method, the glass sheet and the display are bent at a temperature less than a glass transition temperature of the glass sheet to form a curvature having a bending axis in the glass sheet and display. The two overhanging edges are parallel to the bending axis, and each of the two overhanging edges extend beyond the display region at least a distance that is three times a thickness of the display.

According to still another aspect, embodiments of the disclosure relate to a method of forming a curved display assembly. In the method, a curved glass sheet having a first major surface and a second major surface is provided. The second major surface is opposite to the first major surface and defines a curvature having a bending axis. A display is bent over the curvature of the glass sheet. The display includes a display region and two overhanging edges adjacent to the display region that are parallel to the bending axis. Further, in the method, the display is bonded to the second major surface of the glass sheet. The display region is bonded to the second major surface of the glass sheet using a first adhesive, and the two overhanging edges are bonded to the second major surface of the glass sheet using a second adhesive. The second adhesive has a higher modulus than the first adhesive. Each of the two overhanging edges extend beyond the display region at least a distance that is three times a thickness of the display.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Reference will now be made in detail to various embodiments of curved display assemblies, examples of which are illustrated in the accompanying drawings. The curved display assemblies include a cover glass sheet, an outer frame to which the cover glass is attached, a display panel bonded to the cover glass, and a backlight module attached to the outer frame. In embodiments, both the cover glass sheet and the outer frame have a cylindrical shape in the area of the display but may have other shapes and curvatures outside the area of the display. Further, the curved display assemblies may include more than one display, including with different radii of curvature and axes for each display. As will be discussed herein, the display panel is bonded to the cover glass using an optically clear adhesive and, at an outer edge of the display, a second adhesive having a higher elastic modulus is used to bond the edge of the display to the cover glass. The second adhesive creates a bending moment at the edge of the display that reduces the appearance of stress mura (e.g., light leakage from the backlight module resulting from stress in the glass layers). Various aspects and advantages of the curved display assembly and method of forming same will be described in relation to the exemplary embodiments described herein and shown in the figures.

Figure 1:
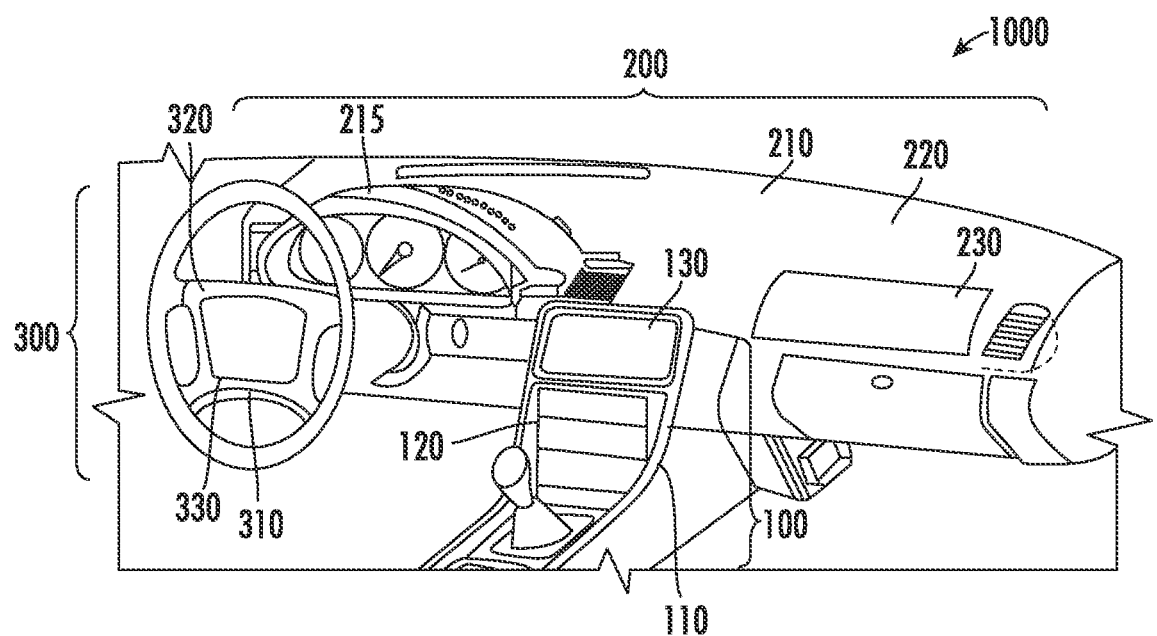
FIG. 1 is a perspective view of a vehicle interior with vehicle interior systems, according to exemplary embodiments.

This curved display assemblies described herein are applicable in a variety of different contexts, including consumer electronics (such as computer monitors, televisions, etc.), appliances, and in various vehicle interiors. In order to illustrate one possible context for use of the curved display assembles, FIG. 1 shows an exemplary vehicle interior 1000 that includes three different embodiments of a vehicle interior system 100, 200, 300 in which one or more curved display assemblies may be incorporated. Vehicle interior system 100 includes a base, shown as center console base 110, with a curved surface 120 including a curved display 130. Vehicle interior system 200 includes a base, shown as dashboard base 210, with a curved surface 220 including a curved display 230. The dashboard base 210 typically includes an instrument panel 215 which may also include a curved display. Vehicle interior system 300 includes a base, shown as steering wheel base 310, with a curved surface 320 and a curved display 330. In one or more embodiments, the vehicle interior system includes a base that is an arm rest, a pillar, a seat back, a floor board, a headrest, a door panel, or any portion of the interior of a vehicle that includes a curved surface. In other embodiments, the base is a portion of a housing for a free-standing display (i.e., a display that is not permanently connected to a portion of the vehicle). As will be described herein, the curved display assembly is mounted to a frame that can be joined to any of the aforementioned bases to provide a curved display within any of the aforementioned bases, among others. As such, the curved display assemblies described herein can be used in each of vehicle interior systems 100, 200 and 300, among others.

Further, the glass material of the curved display assembly may be selected based on its weight, aesthetic appearance, etc. and may be provided with a decorative coating (e.g., an ink or pigment coating) with a pattern (e.g., a brushed metal appearance, a wood grain appearance, a leather appearance, a colored appearance, etc.) to visually match the glass components with adjacent non-glass components. In specific embodiments, such ink or pigment coating may have a transparency level that provides for deadfront functionality. Additionally or alternatively, the glass material may be provided with a functional coating, such as a coating providing touch functionality.

Figure 2:
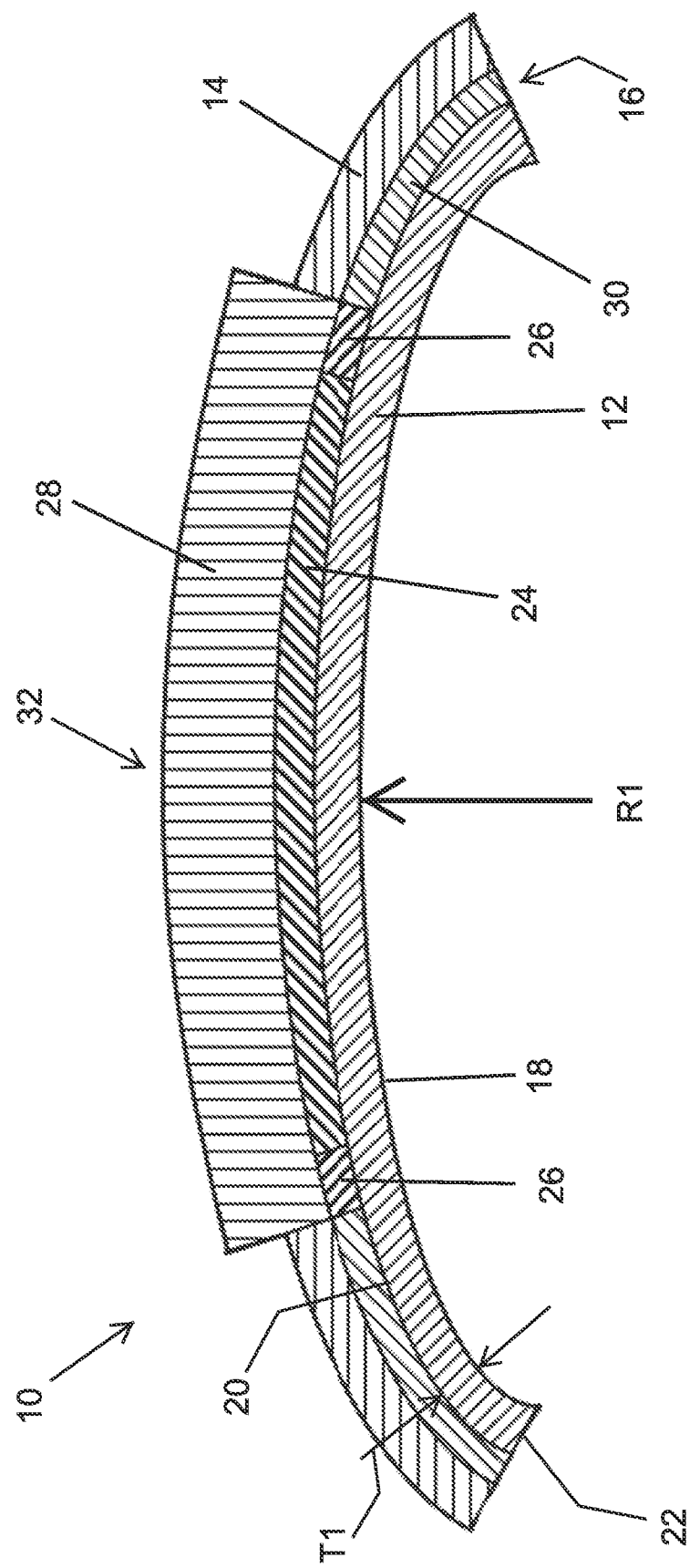
FIG. 2 depicts a curved glass assembly, according to an exemplary embodiment.

FIG. 2 depicts a curved display assembly 10, such as the cover glass for curved display 130, 230, 330 according to exemplary embodiments. It should be understood that, while FIG. 2 is described in terms of forming curved display 130, 230, 330, the curved display assembly 10 of FIG. 2 may be used in any suitable curved glass application, including any curved glass component of any of the vehicle interior systems of FIG. 1 or other curved glass surfaces of the vehicle interior 1000. Such curved glass components could be display or non-display regions, e.g., a flat display area and a curved non-display area, curved displays, and curved display and curved non-display areas.

FIG. 2 depicts a cross-sectional view of a curved display assembly 10 according to an exemplary embodiment. As shown in FIG. 2, the curved display assembly 10 includes a curved glass sheet 12 bonded to a frame 14 via an adhesive layer 16. The glass sheet 12 has a first major surface 18 and a second major surface 20 opposite to the first major surface 18. The distance between the first major surface 18 and the second major surface 20 define a thickness T1 therebetween. Further, the first major surface 18 and the second major surface 20 are connected by a minor surface 22 that extends around the periphery of the glass sheet 12.

The glass sheet 12 has a curved shape such that first major surface 18 and second major surface 20 each include at least one curved section having a radius of curvature R1. In embodiments, R1 is between 30 mm and 5 m. Further, in embodiments, the glass sheet 12 has a thickness T1 (e.g., an average thickness measured between surfaces 18, 20) that is in a range from 0.05 mm to 2 mm. In specific embodiments, T1 is less than or equal to 1.5 mm and in more specific embodiments, T1 is 0.3 mm to 1.3 mm. Applicant has found that such thin glass sheets can be cold formed to a variety of curved shapes utilizing cold forming without breakage while at the same time providing for a high quality cover layer for a variety of vehicle interior applications. In addition, such thin glass sheets 12 may deform more readily, which could potentially compensate for shape mismatches and gaps that may exist relative to the frame 14.

In various embodiments, first major surface 18 and/or the second major surface 20 of glass sheet 12 includes one or more surface treatments or layers. The surface treatment may cover at least a portion of the first major surface 18 and/or second major surface 20. Exemplary surface treatments include anti-glare surfaces/coatings, anti-reflective surfaces/coatings, and an easy-to-clean surface coating/treatment. In one or more embodiments, at least a portion of the first major surface 18 and/or the second major surface 20 may include any one, any two or all three of an anti-glare surface, an anti-reflective surface, and easy-to-clean coating/treatment. For example, first major surface 18 may include an anti-glare surface and second major surface 20 may include an anti-reflective surface. In another example, first major surface 18 includes an anti-reflective surface and second major surface 20 includes an anti-glare surface. In yet another example, the first major surface 18 comprises the easy-to-clean coating, and the second major surface 20 includes either one of or both the anti-glare surface and the anti-reflective surface. In one or more embodiments, the anti-glare surface includes an etched surface. In one or more embodiments, the anti-reflective surface includes a multi-layer coating.

In embodiments, the glass sheet 12 may also include a pigment design on the first major surface 18 and/or second major surface 20. The pigment design may include any aesthetic design formed from a pigment (e.g., ink, paint and the like) and can include, e.g., a wood-grain design, a brushed metal design, a graphic design, a portrait, or a logo. The pigment design may be printed onto the glass sheet.

In general, glass sheet 12 can be cold formed or cold bent to the desired curved shape via application of a bending force to the glass sheet 12 while it is situated on a chuck having a curved surface. Advantageously, it is easier to apply surface treatments to a flat glass sheet 12 prior to creating the curvature in the glass sheet 12, and cold-forming allows the treated glass sheet 12 to be bent without destroying the surface treatment. In embodiments, the cold forming process is performed at a temperature less than the glass transition temperature of the glass sheet 12. In particular, the cold forming process may be performed at room temperature (e.g., about 20° C.) or a slightly elevated temperature, e.g., at 200° C. or less, 150° C. or less, 100° C. or less, or at 50° C. or less. Notwithstanding, the teachings of the present disclosure with respect to reducing stress mura in displays applies as well to hot-formed glass sheets 12 used in curved display assemblies 10.

As shown in FIG. 2, the adhesive layer 16 is disposed on the second major surface 20 of the glass sheet 12. The adhesive layer 16 includes a first adhesive 24 and a second adhesive 26 that bond one or more displays 28 to the second major surface 20 of the glass sheet 12. The adhesive layer 16 includes a third adhesive 30 to bond the frame 14 to the second major surface 20 of the glass sheet 12. In an embodiment, the first adhesive 24 is an optically clear adhesive, and the second adhesive 26 and the third adhesive 30 are structural adhesives. In embodiments, the second adhesive 26 and the third adhesive 30 are the same adhesive, and in other embodiments, the second adhesive 26 and the third adhesive are different adhesives.

In embodiments, the second and third adhesives 24, 30 provide long term strength after curing over the course of, e.g., about an hour at ambient temperature. In embodiments, exemplary adhesives for the second and third adhesives 24, 30 include at least one of a toughened epoxy, a flexible epoxy, an acrylic, a silicone, a urethane, a polyurethane, or a silane modified polymer. In specific embodiments, the second and third adhesives 24, 30 include one or more toughened epoxies, such as EP21TDCHT-LO (available from Masterbond®, Hackensack, NJ), 3M™ Scotch-Weld™ Epoxy DP460 Off-White (available from 3M, St. Paul, MN). In other embodiments, the second and third adhesives 24, 30 include one or more flexible epoxies, such as Masterbond EP21TDC-2LO (available from Masterbond®, Hackensack, NJ), 3M™ Scotch-Weld™ Epoxy 2216 B/A Gray (available from 3M, St. Paul, MN), and 3M™ Scotch-Weld™ Epoxy DP125. In still other embodiments, the second and third adhesives 24, 30 include one or more acrylics, such as LORD® Adhesive 410/Accelerator 19 w/LORD® AP 134 primer, LORD® Adhesive 852/LORD® Accelerator 25 GB (both being available from LORD Corporation, Cary, NC), DELO PUR SJ9356 (available from DELO Industrial Adhesives, Windach, Germany), Loctite® AA4800, Loctite® HF8000, TEROSON® MS 9399, and TEROSON® MS 647-2C (these latter four being available from Henkel AG & Co. KGaA, Dusseldorf, Germany), among others. In yet other embodiments, the second and third adhesives 24, 30 include one or more urethanes, such as 3M™ Scotch-Weld™ Urethane DP640 Brown and 3M™ Scotch-Weld™ Urethane DP604, and in still further embodiments, the second and third adhesives 24, 30 include one or more silicones, such as Dow Corning® 995 (available from Dow Corning Corporation, Midland, MI). The first adhesive 24 may be any of a variety of suitable (i.e., optically clear) epoxies, urethanes, silicones, or acrylics.

In embodiments, the first adhesive 24 has an elastic modulus less than the elastic modulus of the second adhesive 26. In embodiments, the first adhesive 24 has an elastic modulus of less than 0.5 MPa, particularly in the range of 10 kPa to 100 kPa. In embodiments, the second adhesive 26 has an elastic modulus of at least 0.5 MPa, e.g., in the range of 0.5 MPa to 20 MPa. Further, in embodiments, third adhesive 30 has an elastic modulus of at least 2.0 MPa, e.g., in the range of 2.0 MPa to 20 MPa.

In the embodiment depicted, the display 28 is curved and is provided on a curved region 32 of the second glass sheet 12. In embodiments, the glass article 10 can be any of a variety of curved shapes, such as V-shaped (e.g., having flat sections on either side of a curved region 32), C-shaped (continuously curved bend region 32 between ends of the curved display assembly 10), J-shaped (one flat section and one bend region 32), S-shaped (two bend regions 32 with opposite curvatures), among other possible configurations. Each display 28 may be any of a variety of suitable display types, such as liquid crystal display (LCD), light emitting diode (LED), organic LED (OLED), quantum dot LED (QLED), or a plasma display. Further, the display 28 or glass sheet 12 may include touch functionality for interaction with the display 28 and/or with the system into which the display is incorporated.

Figure 3:
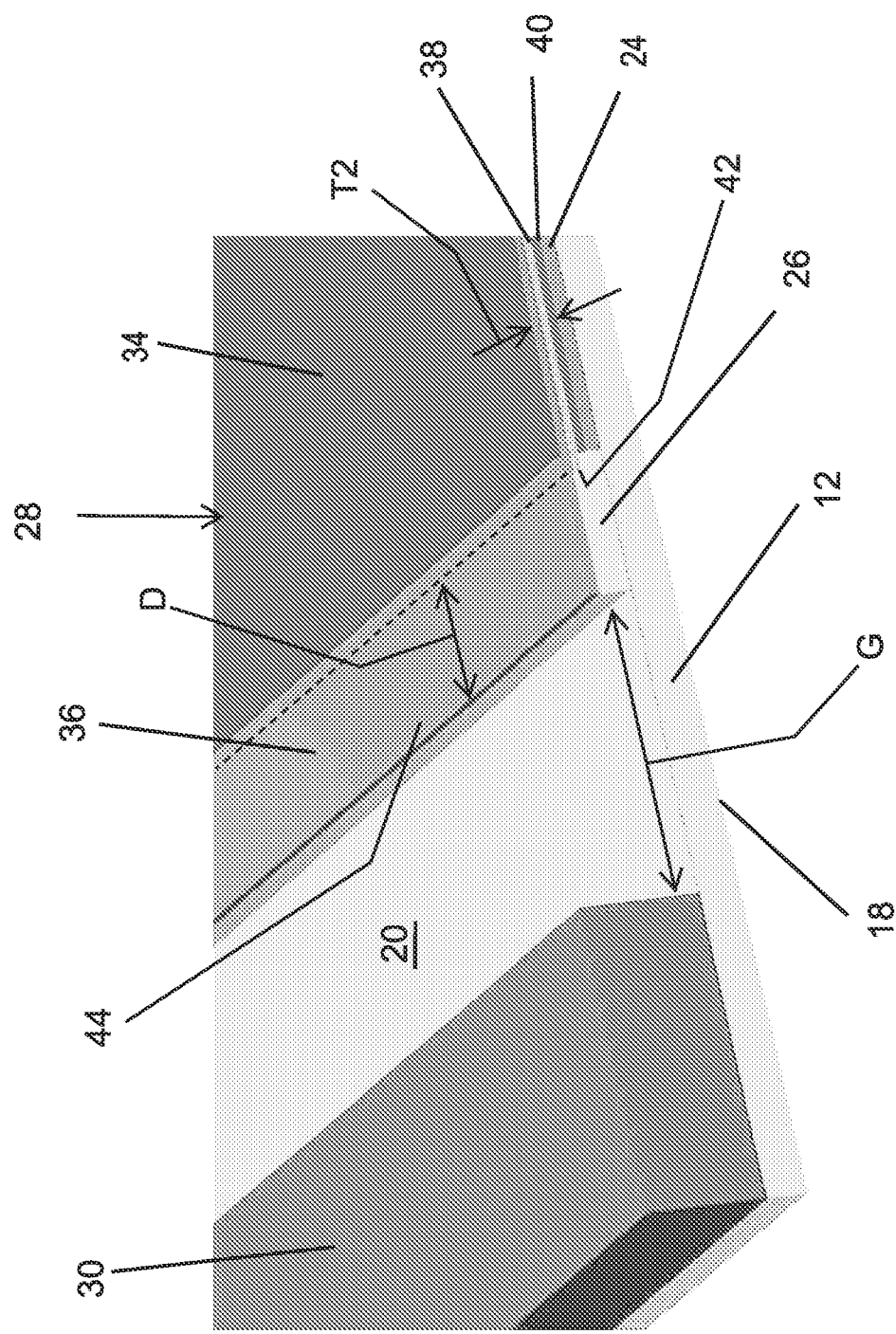
FIG. 3 depicts a close-up view of an LCD bonded to a glass sheet, according to an exemplary embodiment.

In order to illustrate the bonding of the display 28 to the glass sheet 12, FIG. 3 depicts an LCD 28 bonded to the glass sheet 12, and the following discussion will be framed in terms of an LCD. However, this discussion is illustrative in nature and is not meant to imply that concepts discussed therein only apply to LCD. Instead, the concepts apply as well to LED, OLED, QLED, and plasma displays, among others.

In conventional LCD, mura may appear as a result of stress (i.e., "stress mura") in the glass layers of the display. In such LCD, stress in glass layers may cause birefringence, which alters the polarization of the light transmitted by the glass. In conventional LCD, this alteration of polarization can allow some light to be transmitted by the display when it is desired that no light be transmitted. Light transmitted by the display when it is desired to be dark is called light leakage. While other sources of light leakage exist, stress in the glass layers of an LCD is one of the most prevalent. However, not all stress in the glass layers of an LCD causes light leakage. When the principal axes of the stress in a glass layers are aligned perpendicular and parallel to the polarization of the light transmitted, the polarization is not altered, so no light leakage is caused. For this reason, curved LCD often have front and rear polarizers aligned parallel and perpendicular to the axis of curvature. In that case the polarization axes align with the principal axes of stress in the glass layers, as long as the glass is bent into a cylindrical shape.

Notwithstanding, deviations from a cylindrical shape cause principal axes of stress in the glass to rotate from the nominal axis of curvature. In this regard, it is difficult to force large display panels to conform to a cylindrical shape in which the principal axes of stress remain parallel and perpendicular to the polarization of the transmitted light. According to the present disclosure and as will be described below, the use of the second adhesive 26, having a higher modulus than the optically clear first adhesive 24, along the edge of the display 28 substantially reduces light leakage that would otherwise result from the deviations associated with bending a display 28 into a cylindrical shape. In particular, the second adhesive 26 applies a moment along the edges of the display to maintain the cylindrical shape. Conventionally, a soft, optically clear adhesive was used to apply the moment, and the resulting deformation caused stress distribution in the display panel that resulted in light leakage optical defects (i.e., stress mura) in the display assembly. By using a second adhesive 26 with a higher modulus along at least along the edges of the display 28 parallel to the bending axis, such stress mura defects can be substantially reduced or eliminated.

With reference to FIG. 3, an exemplary embodiment of an LCD 28 bonded to a glass sheet 12 is depicted. The LCD 28 includes multiple layers, including a first polarizer 34, a thin-film-transistor (TFT) substrate 36, a color filter (CF) substrate 38, and a second polarizer 40. Although not depicted in FIG. 3 (because of its relatively small size as compared to the other layers of the display 28), the LCD 28 also includes a liquid crystal layer and a sealant around the edges of the liquid crystal layer. The liquid crystal layer is disposed between the TFT substrate 36 and the CF substrate 38. Also not pictured is a backlight for the LCD 28, which would be arranged over the first polarizer 34 (with respect to the orientation depicted in FIG. 3). As can be seen, the TFT substrate 36 extends a distance D beyond at least the peripheral edge 42 of the CF substrate 38. In the depiction of FIG. 3, the peripheral edge 42 is not aligned with the edge of the first or second polarizer 34, 40, and the edge of the CF substrate 38 is denoted by the dashed line. In embodiments, overhang distance D is at least three times the thickness T2 of the display 28 (i.e., D≥3*T2), the display 28 including the first and second polarizers 34, 40, the TFT substrate 36, the CF substrate 38, and the liquid crystal layer and sealant. In embodiments, the display 28 has a thickness T2 of from 0.25 mm to 0.75 mm. Thus, in embodiments, the overhang distance D is at least 0.75 mm, at least 1.0 mm, at least 1.5 mm, at least 2.0 mm, at least 2.5 mm, etc.

When bending the LCD 28 to curve the display, the bending moment is applied to the TFT substrate 36 and transferred to the CF substrate 38 by the sealant around the edges of the liquid crystal layer in particular because the sealant bonds the TFT substrate 36 to the CF substrate 38. Advantageously, having the TFT substrate 36 extend beyond the peripheral edge 42 of the CF substrate 38 provides a mounting surface for display driver electronics on the overhanging edge 44 of the TFT substrate 36. In particular, electronic chips cannot be located on curved edges of the display 28 since the silicon chips add stiffness to the TFT substrate 36, which causes mura from light leakage when the edge is bent.

Figure 4:
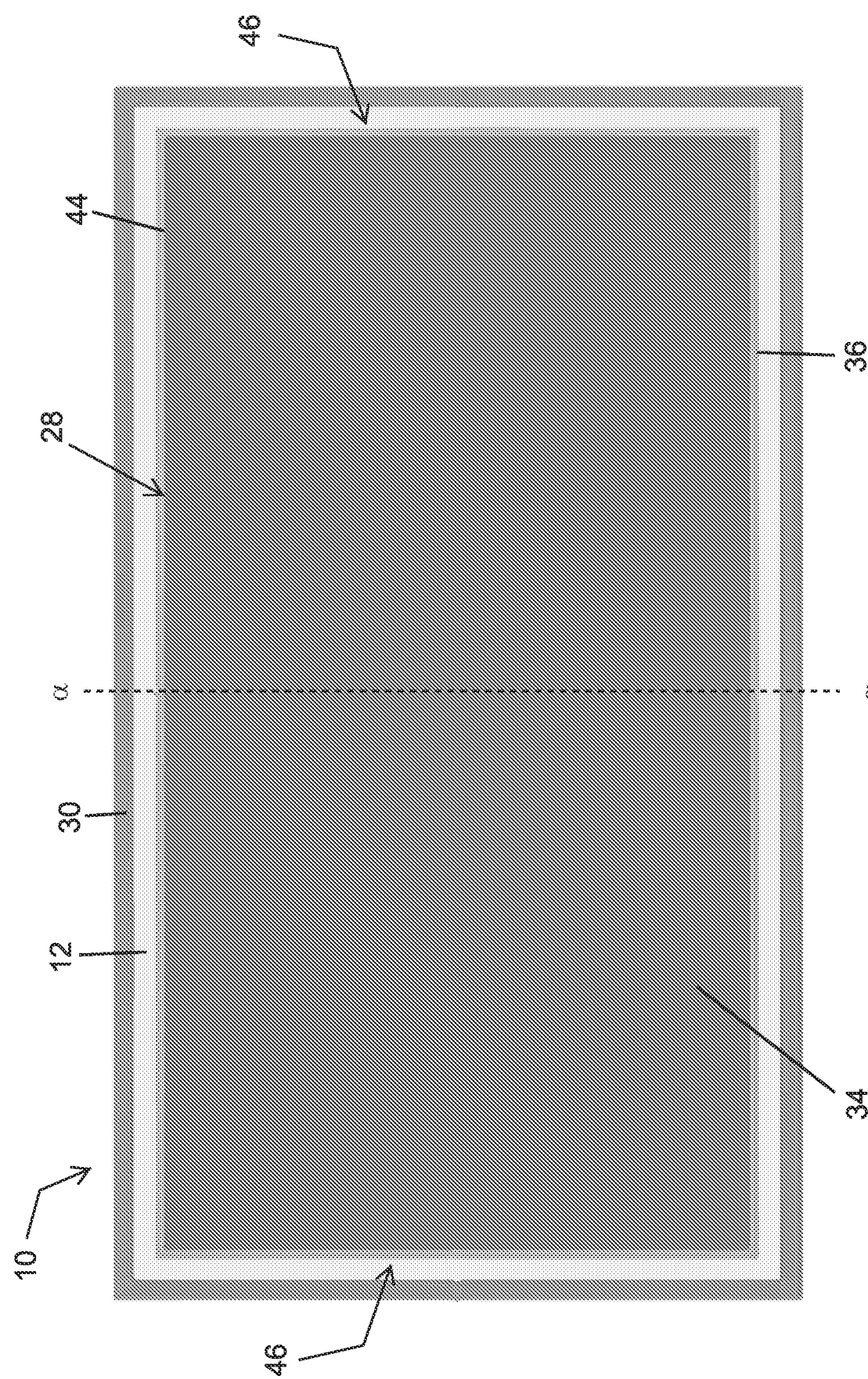
FIG. 4 depicts a rear view of a curved glass assembly according to an exemplary embodiment.

Additionally, the second adhesive 26 is applied on the opposite side of the overhanging edge 44 from the side on which the electronics are mounted. That is, the second adhesive 26 is disposed between the overhanging edge 44 of the TFT substrate 36 and the second major surface of the 20 of the glass sheet 12. FIG. 4 depicts a rear view of glass sheet 12 with mounted LCD 28. As can be seen, in embodiments, the overhanging edge 44 of the TFT substrate 36 extends past the CF substrate 38 around the perimeter of the LCD 28, and in embodiments, the second adhesive 26 is applied to the overhanging edge 44 around the entire perimeter of LCD 28. However, in other embodiments, the second adhesive 26 is only applied on the lateral sides 46 of the TFT substrate 36 that are parallel to a bending axis α of the glass article 10. As show in FIG. 4, the glass article 10 has a single bending axis α around which the glass sheet 12 and LCD 28 are bent. In other embodiments, each curved display 28 of the glass article 10 has a bend axis, and the glass sheet 12 may have multiple bend axes, including bend axes where no display 28 is located. In embodiments, the display 28 is only bent about a single axis such that the bend is cylindrical. Further, while the embodiment of FIG. 3 depicts an overhanging edge 44 having a uniform overhang distance D around the perimeter of the display 28, in embodiments, the overhang distance D is only at least three times larger than the thickness T2 of the display 28 in regions where the second adhesive is applied. That is, the overhang distance D of the overhanging edge 44 is, in embodiments, at least three time greater than the thickness T2 of the display 28 only along the lateral sides 46 parallel to the bend axis α.

While an LCD 28 has been described, the display 28 could be another type of display, and in such other displays 28, one layer of display 28 is made to extend beyond the other layers of the display 28 to provide the overhanging edge 44, or another layer may be added to the display 28 to provide the overhanging edge 44. Additionally, in the LCD embodiment, the TFT substrate 36 provides the overhanging edge 44 because of the synergistic effect of also providing a mounting location for the electronics, but in other embodiments, another layer or an added layer can be used to provide the overhanging edge 44.

Applicant conducted various simulations on curved display assemblies 10 according to the LCD construction described above, including with the TFT substrate 36 providing the overhanging edge 44. The curved display assemblies 10 used for the simulations were given dimensions typical of those for display assemblies found in automotive interior systems. Table 1 provides the materials, thicknesses, and properties of each layer in the curved display assembly 10 used in the simulations. As shown in Table 1, the second adhesive 26 was varied in the simulations to determine the effect on light leakage, and for each simulation discussed below, the particulars of the second adhesive 26 will be provided.

TABLE 1

Layers, Materials, and their Properties in Curved Display Assembly

| Layer | Material | Thickness (mm) | Initial Modulus |
|---|---|---|---|
| Second Polarizer 40 | Polyester | 0.125 | 1.5 GPa |
| CF Substrate 38 | Alkaline Earth Boro-Aluminosilicate glass (e.g., Corning Eagle XG) | 0.150 | 73 GPa |
| Liquid Crystal Layer | Liquid Crystal | 0.004 | N/A |
| TFT Substrate 36 | Alkaline Earth Boro-Aluminosilicate glass (e.g., Corning Eagle XG) | 0.150 | 73 GPa |
| First Polarizer 34 | Polyester | 0.125 | 1.5 GPa |
| Liquid Crystal Sealant | Epoxy | 0.004 | 2.0 GPa |
| Glass sheet 12 | Alkali- | 0.7 | 68 GPa |

TABLE 1-continued

Layers, Materials, and their Properties in Curved Display Assembly

| Layer | Material | Thickness (mm) | Initial Modulus |
|---|---|---|---|
| | Aluminosilicate glass (e.g., Corning Gorilla Glass 5) | | |
| First Adhesive 24 | Optically Clear Adhesive - Silicone | 0.250 | 60 kPa |
| Second Adhesive 26 | Silicone | Various | Various |
| Third Adhesive 30 | Polyurethane | 1.0 | 0.42 MPa |

The simulations and associated data discussed herein considered curved glass assemblies created through cold-bending in which a flat display was first attached to the flat glass sheet and then the flat display and glass sheet were cold-formed to the final shape, but other simulations have shown the perimeter adhesive to be as effective in situations where the glass sheet is hot- or cold-formed first before bending the display over the glass sheet. In the simulations, a mechanical simulation calculated deformation and stress in the assembly, and an optical simulation calculated light leakage of the display. For the simulations, the frame was assumed to be perfectly rigid and cylindrical in shape. Further, the frame was given a radius such that the first major surface 18 of the glass sheet 12 had a nominal radius of curvature R1 of 750 mm. Given the thicknesses of the layers, the frame radius of curvature was calculated to be 751.7 mm. The optically active area of the display was 300 mm wide and 130 mm high. Around the display, the edge of the first adhesive 24 to the edge of the CF substrate 38 was 0.3 mm on all sides. The TFT substrate 36 extended beyond the CF substrate 38 by 2.0 mm on all sides, such that the overhanging edge 44 extended around the entire periphery of the display 28. A gap G (shown in FIG. 3) was provided between the overhanging edge 44 of the TFT substrate 36 to the frame 14. The gap G was 5.0 mm on all sides, and the frame was 5.0 mm wide. The curved glass assembly 10 was rectangular and symmetric. In the simulations, only a quarter of the total assembly was considered, and symmetry was imposed on two sides. For the optical calculations, only light leakage resulting from stress was considered. For the display, when the glass layers (i.e., TFT substrate 36 and CF substrate 38) are unstressed, no light to passed through the display 28. Stress in the glass caused slight rotation of light polarization, allowing some light to pass through the second polarizer 40. The fraction of the incident intensity from the back light unit that passes through the display 28 is referred to as the "light leakage fraction."

Figure 5:
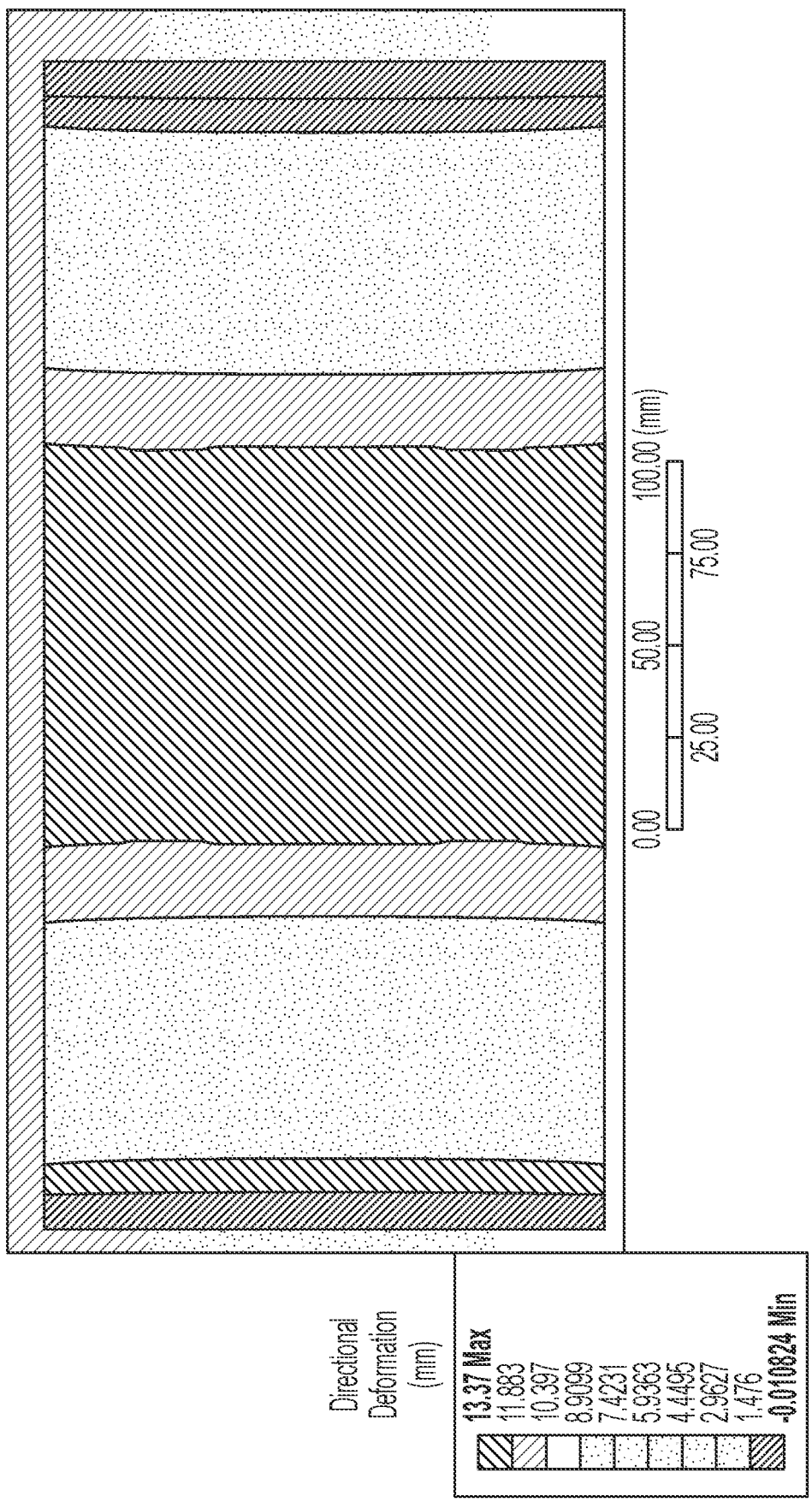
FIG. 5 depicts the directional deformation of a cylindrically bent glass sheet, according to an exemplary embodiment.
Figure 6:
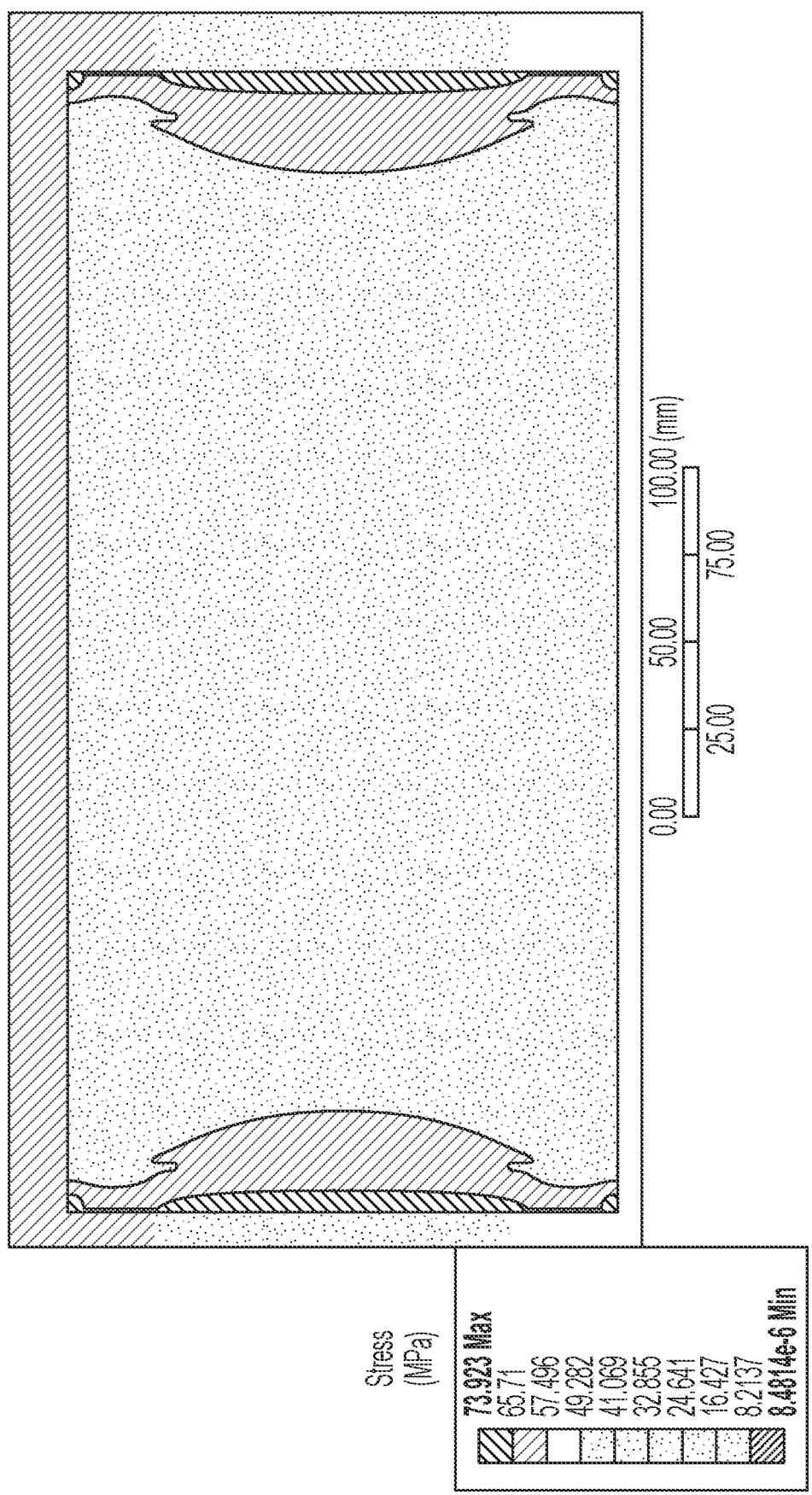
FIG. 6 depicts the stress distribution across the cylindrically bent glass sheet of FIG. 5, according to an exemplary embodiment.
Figure 7:
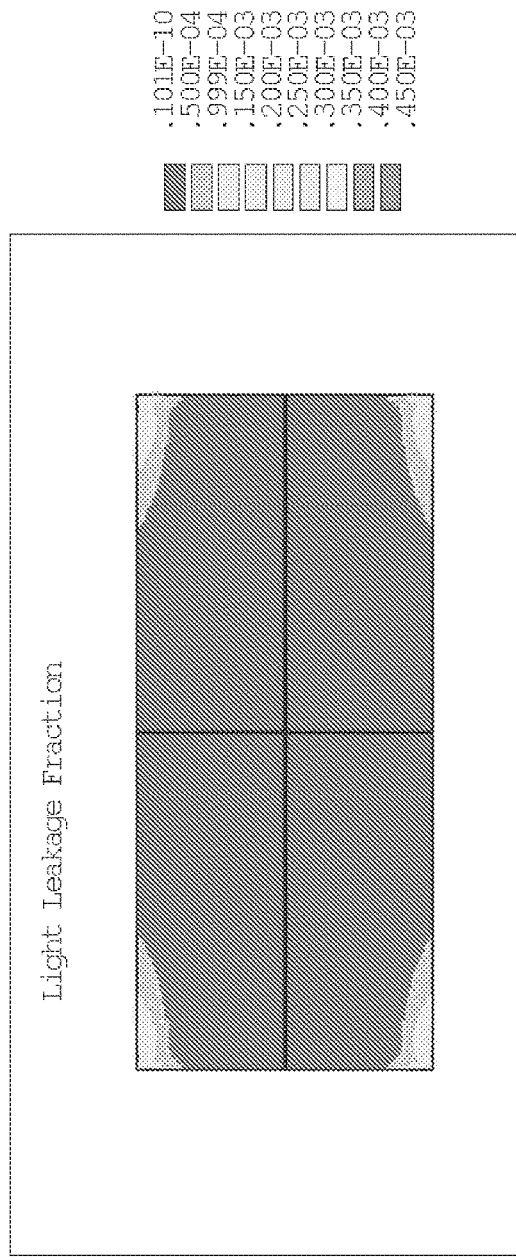
FIGS. 7 and 8 provide a comparison of light leakage fraction for a conventional display assembly (FIG. 7) and a curved display assembly (FIG. 8) according to the present disclosure.
Figure 8:
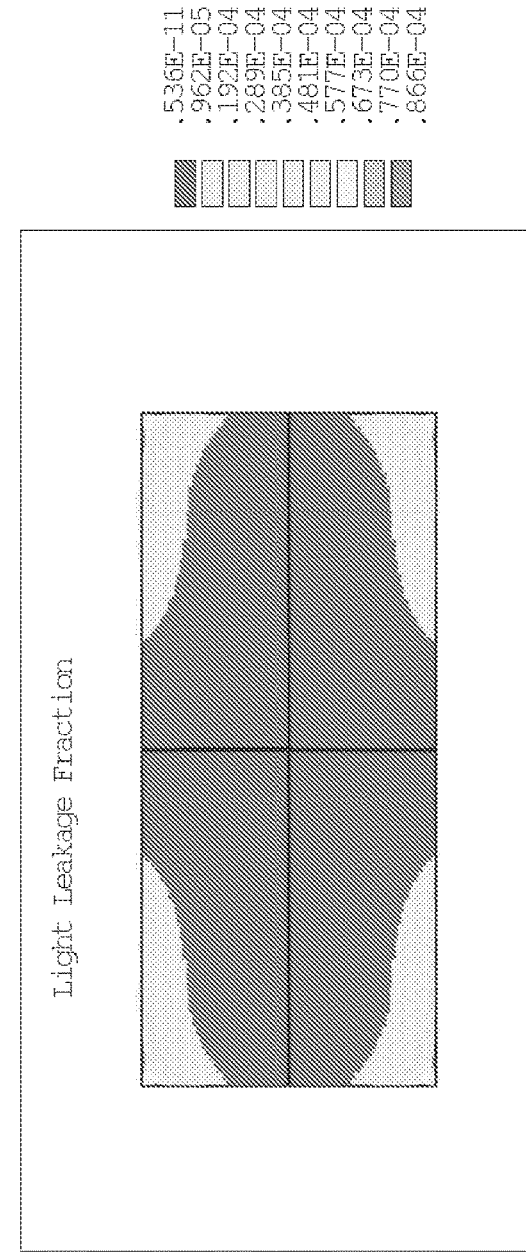

FIG. 5 depicts the simulation results for the deformation of the first major surface 18 of the glass sheet 12. In the simulation, the second adhesive 26 was provided around the entire perimeter of the display 28, and the second adhesive 26 had an initial elastic modulus of 1.0 MPa. As can be seen in FIG. 5, the curvature deviates slightly from a perfect cylinder, which is most noticeable at the top and bottom of the deformation curve shown in FIG. 5. FIG. 6 depicts the stress distribution across the first major surface 18 of the glass sheet 12. From FIG. 6, it can be seen that the highest stress occurs at the right and left edges of the glass sheet 12 where the bending moment is applied from the frame 14 to cause curvature. FIG. 7 depicts the light leakage fraction for a conventional display bonded to a glass sheet using only optically clear adhesive, i.e., the display does not include the second adhesive 26 between an overhanging edge 44 and the glass sheet 12 according to the curved display assemblies 10 disclosed herein. FIG. 8 depicts the light leakage fraction in the display 28 as described above with respect to the other simulations in which the second adhesive 26 was applied around the perimeter of the display 28. As can be seen in a comparison of FIGS. 7 and 8, the display without the perimeter adhesive has light leakage that is at least an order of magnitude higher than the display 28 according to the present disclosure.

Having demonstrated that using a second adhesive 26 to bond the overhanging edge 44 to the glass sheet 12 reduces light leakage, the effect of display size was considered. The results are summarized in Table 2, below. The simulations used to provide the data in Table 2 considered a display constructed as discussed above (i.e., second adhesive having modulus of 1.0 MPa, 750 mm bending radius, and materials as disclosed in Table 1).

TABLE 2

Effect of Display Size on Light Leakage

| | | Max Light Leakage Fraction | |
|---|---|---|---|
| Display width (mm) | Display height (mm) | with second adhesive 26 | without second adhesive 26 |
| 250 | 130 | 7.89E−05 | 4.18E−04 |
| 300 | 130 | 8.66E−05 | 4.50E−04 |
| 350 | 130 | 9.39E−05 | 4.80E−04 |

From Table 2, it can again be seen that the use of the second adhesive 26 to bond the overhanging edge 44 to the glass sheet 12 reduces the light leakage by about an order of magnitude even as the width of the display increases from 250 mm to 350 mm.

Table 3, below, considers the effect of using the second adhesive 26 only on the lateral sides 46 of the display 28 instead of around the entire perimeter of the display 28. Further, the extent of the adhesive was varied. As can be seen in Table 3, the maximum light leakage fraction is similar in magnitude to the curved display assemblies having the second adhesive 26 applied around the entire perimeter. Further, as the adhesive reaches the full extent of the overhanging edge 44, the maximum light leakage was the same (8.66E-05) as it was for the curved display assemblies having the second adhesive around the entire perimeter.

TABLE 3

Effect of Extent of Second Adhesive on Light Leakage

| Display width (mm) | Display height (mm) | Second Adhesive 26 extent from overhanging edge 44 (mm) | Max Light Leakage Fraction |
|---|---|---|---|
| 300 | 130 | none | 4.50E−04 |
| 300 | 130 | 10 | 9.49E−05 |
| 300 | 130 | 20 | 8.73E−05 |
| 300 | 130 | full | 8.66E−05 |

Figure 9:
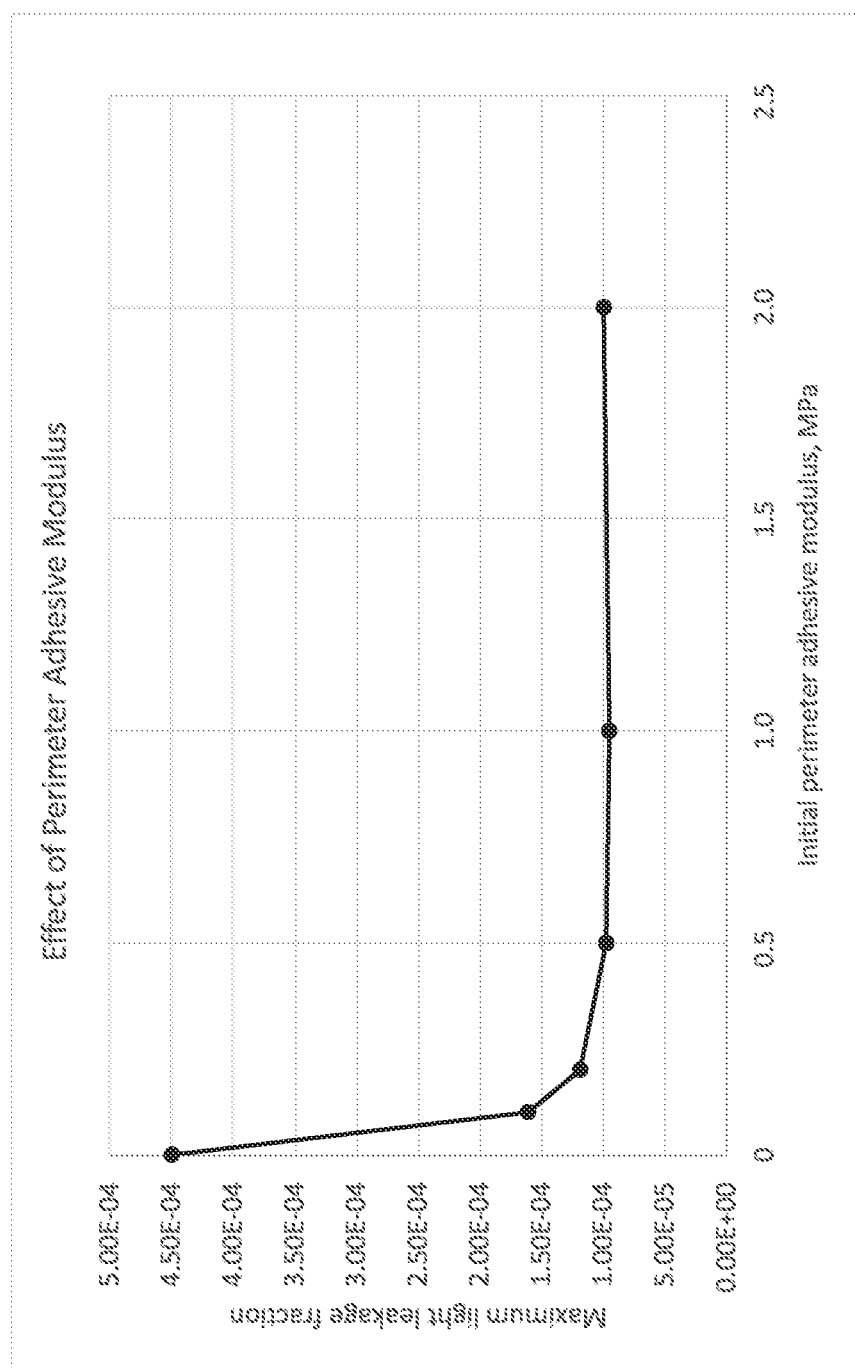
FIG. 9 depicts the maximum light leakage fraction as a function of adhesive modulus, according to exemplary embodiments.

FIG. 9 considers the effect of the modulus of the second adhesive 26 on light leakage. As can be seen in FIG. 9, the light leakage decreases rapidly as the modulus approaches 0.5 MPa and remains low as the modulus increases above 0.5 MPa.

The curved glass assemblies 10 described herein can be assembled in a variety of ways. In particular, the glass sheet 12 of the curved glass assemblies can be hot- or cold-formed. For example, according to a first method, the flat displays 28 are bonded to the flat glass sheet 12 using the first and second adhesives 24, 26. The glass sheet 12 with displays 28 bonded thereon is then cold-formed over a chuck (such as a vacuum chuck) to provide the desired curvature for the glass sheet 12 and display 28. While on the chuck, the frame 14 is bonded to the glass sheet 12 using the third adhesive 30, and the backlight is attached to the display 28. The adhesives 24, 26, 30 are allowed to cure, and the finished curved glass assembly is removed from the chuck.

In a second method, the glass sheet 12 is first cold-formed over a chuck. The display 28 is cold-bent and bonded to the glass sheet 12 using the first and second adhesives 24, 26. Thereafter, the frame 14 is bonded to the glass sheet 12 using the third adhesive 30, the backlight unit is attached to the display 28, and after curing, the finished curved display assembly 10 is removed from the chuck.

According to a third method, the glass sheet 12 is permanently bent using hot-forming techniques. The display 28 is cold-bent over the glass sheet 12 and bonded thereto using the first and second adhesives 24, 26. The frame 14 is then bonded to the glass sheet 12 using the third adhesive 30, the backlight unit is attached to the display 28, and after curing, the finished curved display assembly 10 is removed from the chuck.

In various embodiments, glass sheet 12 is formed from a strengthened glass sheet (e.g., a thermally strengthened glass material, a chemically strengthened glass sheet, etc.) In such embodiments, when glass sheet 12 is formed from a strengthened glass material, first major surface 18 and second major surface 20 are under compressive stress, and thus second major surface 20 can experience greater tensile stress during bending to the convex shape without risking fracture. This allows for strengthened glass sheet 12 to conform to more tightly curved surfaces.

A feature of a cold-formed glass sheet 12 is an asymmetric surface compressive between the first major surface 18 and the second major surface 20 once the glass sheet 12 has been bent to the curved shape. In such embodiments, prior to the cold-forming process or being cold-formed, the respective compressive stresses in the first major surface 18 and the second major surface 20 of glass sheet 12 are substantially equal. After cold-forming, the compressive stress on concave first major surface 18 increases such that the compressive stress on the first major surface 18 is greater after cold-forming than before cold-forming. In contrast, convex second major surface 20 experiences tensile stresses during bending causing a net decrease in surface compressive stress on the second major surface 20, such that the compressive stress in the second major surface 20 following bending is less than the compressive stress in the second major surface 20 when the glass sheet is flat.

As noted above, in addition to providing processing advantages such as eliminating expensive and/or slow heating steps, the cold-forming processes discussed herein are believed to generate curved display assemblies with a variety of properties that are superior to hot-formed glass articles, particularly for vehicle interior or display cover glass applications. For example, Applicant believes that, for at least some glass materials, heating during hot-forming processes decreases optical properties of curved glass sheets, and thus, the curved glass sheets formed utilizing the cold-bending processes/systems discussed herein provide for both curved glass shapes along with improved optical qualities not believed achievable with hot-bending processes.

Further, many glass surface treatments (e.g., anti-glare coatings, anti-reflective coatings, easy-to-clean coating, etc.) are applied via deposition processes, such as sputtering processes that are typically ill-suited for coating curved glass articles. In addition, many surface treatments (e.g., anti-glare coatings, anti-reflective coatings, easy-to-clean coating, etc.) also are not able to survive the high temperatures associated with hot-bending processes. Thus, in particular embodiments discussed herein, one or more surface treatments are applied to the first major surface 18 and/or to the second major surface 20 of glass sheet 12 prior to cold-bending, and the glass sheet 12 including the surface treatment is bent to a curved shape as discussed herein. Thus, Applicant believes that the processes and systems discussed herein allow for bending of glass after one or more coating materials have been applied to the glass, in contrast to typical hot-forming processes.

Figure 10:
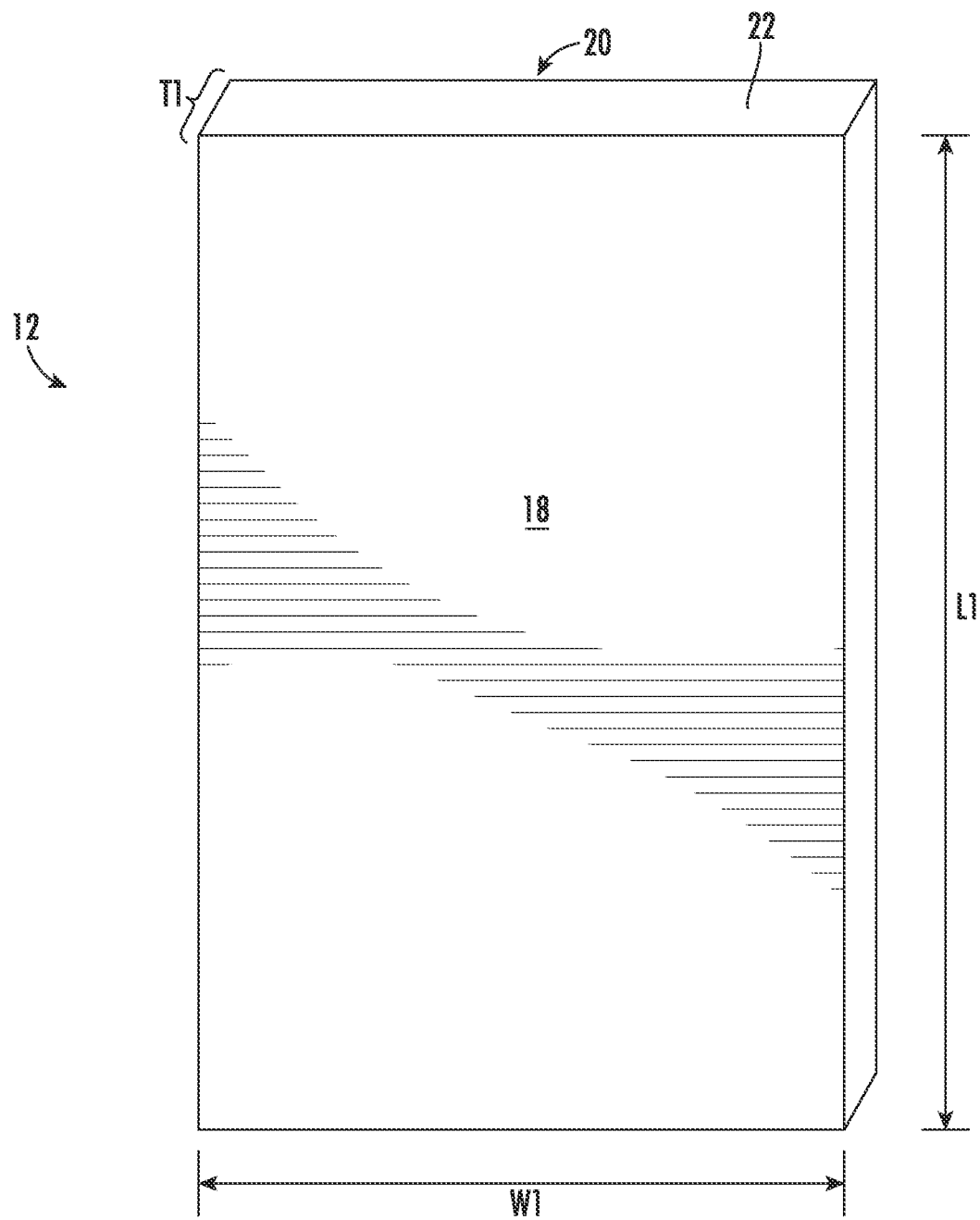
FIG. 10 depicts a glass sheet with exemplary dimensions, according to an exemplary embodiment.

Referring to FIG. 10, additional structural details of glass sheet 12 are shown and described. As noted above, glass sheet 12 has a thickness T1 that is substantially constant and is defined as a distance between the first major surface 18 and the second major surface 20. In various embodiments, T1 may refer to an average thickness or a maximum thickness of the glass sheet. In addition, glass sheet 12 includes a width W1 defined as a first maximum dimension of one of the first or second major surfaces 18, 20 orthogonal to the thickness T1, and a length L1 defined as a second maximum dimension of one of the first or second major surfaces 18 20 orthogonal to both the thickness and the width. In other embodiments, W1 and L1 may be the average width and the average length of glass sheet 12, respectively.

In various embodiments, thickness T1 is 2 mm or less and specifically is 0.3 mm to 1.5 mm. For example, thickness T1 may be in a range from about 0.1 mm to about 1.5 mm, from about 0.15 mm to about 1.5 mm, from about 0.2 mm to about 1.5 mm, from about 0.25 mm to about 1.5 mm, from about 0.3 mm to about 1.5 mm, from about 0.35 mm to about 1.5 mm, from about 0.4 mm to about 1.5 mm, from about 0.45 mm to about 1.5 mm, from about 0.5 mm to about 1.5 mm, from about 0.55 mm to about 1.5 mm, from about 0.6 mm to about 1.5 mm, from about 0.65 mm to about 1.5 mm, from about 0.7 mm to about 1.5 mm, from about 0.1 mm to about 1.4 mm, from about 0.1 mm to about 1.3 mm, from about 0.1 mm to about 1.2 mm, from about 0.1 mm to about 1.1 mm, from about 0.1 mm to about 1.05 mm, from about 0.1 mm to about 1 mm, from about 0.1 mm to about 0.95 mm, from about 0.1 mm to about 0.9 mm, from about 0.1 mm to about 0.85 mm, from about 0.1 mm to about 0.8 mm, from about 0.1 mm to about 0.75 mm, from about 0.1 mm to about 0.7 mm, from about 0.1 mm to about 0.65 mm, from about 0.1 mm to about 0.6 mm, from about 0.1 mm to about 0.55 mm, from about 0.1 mm to about 0.5 mm, from about 0.1 mm to about 0.4 mm, or from about 0.3 mm to about 0.7 mm. In other embodiments, the T1 falls within any one of the exact numerical ranges set forth in this paragraph.

In various embodiments, width W1 is in a range from 5 cm to 250 cm, from about 10 cm to about 250 cm, from about 15 cm to about 250 cm, from about 20 cm to about 250 cm, from about 25 cm to about 250 cm, from about 30 cm to about 250 cm, from about 35 cm to about 250 cm, from about 40 cm to about 250 cm, from about 45 cm to about 250 cm, from about 50 cm to about 250 cm, from about 55 cm to about 250 cm, from about 60 cm to about 250 cm, from about 65 cm to about 250 cm, from about 70 cm to about 250 cm, from about 75 cm to about 250 cm, from about 80 cm to about 250 cm, from about 85 cm to about 250 cm, from about 90 cm to about 250 cm, from about 95 cm to about 250 cm, from about 100 cm to about 250 cm, from about 110 cm to about 250 cm, from about 120 cm to about 250 cm, from about 130 cm to about 250 cm, from about 140 cm to about 250 cm, from about 150 cm to about 250 cm, from about 5 cm to about 240 cm, from about 5 cm to about 230 cm, from about 5 cm to about 220 cm, from about 5 cm to about 210 cm, from about 5 cm to about 200 cm, from about 5 cm to about 190 cm, from about 5 cm to about 180 cm, from about 5 cm to about 170 cm, from about 5 cm to about 160 cm, from about 5 cm to about 150 cm, from about 5 cm to about 140 cm, from about 5 cm to about 130 cm, from about 5 cm to about 120 cm, from about 5 cm to about 110 cm, from about 5 cm to about 110 cm, from about 5 cm to about 100 cm, from about 5 cm to about 90 cm, from about 5 cm to about 80 cm, or from about 5 cm to about 75 cm. In other embodiments, W1 falls within any one of the exact numerical ranges set forth in this paragraph.

In various embodiments, length L1 is in a range from about 5 cm to about 1500 cm, from about 50 cm to about 1500 cm, from about 100 cm to about 1500 cm, from about 150 cm to about 1500 cm, from about 200 cm to about 1500 cm, from about 250 cm to about 1500 cm, from about 300 cm to about 1500 cm, from about 350 cm to about 1500 cm, from about 400 cm to about 1500 cm, from about 450 cm to about 1500 cm, from about 500 cm to about 1500 cm, from about 550 cm to about 1500 cm, from about 600 cm to about 1500 cm, from about 650 cm to about 1500 cm, from about 650 cm to about 1500 cm, from about 700 cm to about 1500 cm, from about 750 cm to about 1500 cm, from about 800 cm to about 1500 cm, from about 850 cm to about 1500 cm, from about 900 cm to about 1500 cm, from about 950 cm to about 1500 cm, from about 1000 cm to about 1500 cm, from about 1050 cm to about 1500 cm, from about 1100 cm to about 1500 cm, from about 1150 cm to about 1500 cm, from about 1200 cm to about 1500 cm, from about 1250 cm to about 1500 cm, from about 1300 cm to about 1500 cm, from about 1350 cm to about 1500 cm, from about 1400 cm to about 1500 cm, or from about 1450 cm to about 1500 cm. In other embodiments, L1 falls within any one of the exact numerical ranges set forth in this paragraph.

In various embodiments, one or more radius of curvature (e.g., R1 shown in FIG. 2) of glass sheet 12 is about 30 mm or greater. For example, R1 may be in a range from about 30 mm to about 5000 mm, from about 50 mm to about 5000 mm, from about 70 mm to about 5000 mm, from about 90 mm to about 5000 mm, from about 110 mm to about 5000 mm, from about 150 mm to about 5000 mm, from about 200 mm to about 5000 mm, from about 250 mm to about 5000 mm, from about 300 mm to about 5000 mm, from about 350 mm to about 5000 mm, from about 400 mm to about 5000 mm, from about 450 mm to about 5000 mm, from about 500 mm to about 5000 mm, from about 550 mm to about 5000 mm, from about 600 mm to about 5000 mm, from about 650 mm to about 5000 mm, from about 700 mm to about 5000 mm, from about 750 mm to about 5000 mm, from about 800 mm to about 5000 mm, from about 850 mm to about 5000 mm, from about 900 mm to about 5000 mm, from about 950 mm to about 5000 mm, from about 1000 mm to about 5000 mm, from about 1500 mm to about 5000 mm, from about 2000 mm to about 5000 mm, from about 2500 mm to about 5000 mm, from about 3000 mm to about 5000 mm, from about 3500 mm to about 5000 mm, from about 4000 mm to about 5000 mm, from about 4500 mm to about 5000 mm, from about 30 mm to about 4500 mm, from about 30 mm to about 4000 mm, from about 30 mm to about 3500 mm, from about 30 mm to about 3000 mm, from about 30 mm to about 2500 mm, from about 30 mm to about 2000 mm, from about 30 mm to about 1500 mm, from about 30 mm to about 1000 mm, from about 30 mm to about 950 mm, from about 30 mm to about 900 mm, from about 30 mm to about 850 mm, from about 30 mm to about 800 mm, from about 30 mm to about 750 mm, from about 30 mm to about 700 mm, from about 30 mm to about 650 mm, from about 30 mm to about 600 mm, from about 30 mm to about 550 mm, from about 30 mm to about 500 mm, from about 30 mm to about 450 mm, or from about 30 mm to about 400 mm. In other embodiments, R1 falls within any one of the exact numerical ranges set forth in this paragraph.

The various embodiments of the vehicle interior system may be incorporated into vehicles such as trains, automobiles (e.g., cars, trucks, buses and the like), sea craft (boats, ships, submarines, and the like), and aircraft (e.g., drones, airplanes, jets, helicopters and the like).

Strengthened Glass Properties

As noted above, glass sheet 12 may be strengthened. In one or more embodiments, glass sheet 12 may be strengthened to include compressive stress that extends from a surface to a depth of compression (DOC). The compressive stress regions are balanced by a central portion exhibiting a tensile stress. At the DOC, the stress crosses from a positive (compressive) stress to a negative (tensile) stress.

In various embodiments, glass sheet 12 may be strengthened mechanically by utilizing a mismatch of the coefficient of thermal expansion between portions of the article to create a compressive stress region and a central region exhibiting a tensile stress. In some embodiments, the glass sheet may be strengthened thermally by heating the glass to a temperature above the glass transition point and then rapidly quenching.

In various embodiments, glass sheet 12 may be chemically strengthened by ion exchange. In the ion exchange process, ions at or near the surface of the glass sheet are replaced by—or exchanged with—larger ions having the same valence or oxidation state. In those embodiments in which the glass sheet comprises an alkali aluminosilicate glass, ions in the surface layer of the article and the larger ions are monovalent alkali metal cations, such as $Li^+$, $Na^+$, $K^+$, $Rb^+$, and $Cs^+$. Alternatively, monovalent cations in the surface layer may be replaced with monovalent cations other than alkali metal cations, such as $Ag^+$ or the like. In such embodiments, the monovalent ions (or cations) exchanged into the glass sheet generate a stress.

Ion exchange processes are typically carried out by immersing a glass sheet in a molten salt bath (or two or more molten salt baths) containing the larger ions to be exchanged with the smaller ions in the glass sheet. It should be noted that aqueous salt baths may also be utilized. In addition, the composition of the bath(s) may include more than one type of larger ions (e.g., Na+ and K+) or a single larger ion. It will be appreciated by those skilled in the art that parameters for the ion exchange process, including, but not limited to, bath composition and temperature, immersion time, the number of immersions of the glass sheet in a salt bath (or baths), use of multiple salt baths, additional steps such as annealing, washing, and the like, are generally determined by the composition of the glass sheet (including the structure of the article and any crystalline phases present) and the desired DOC and CS of the glass sheet that results from strengthening. Exemplary molten bath compositions may include nitrates, sulfates, and chlorides of the larger alkali metal ion. Typical nitrates include $KNO_3$, $NaNO_3$, $LiNO_3$, $NaSO_4$ and combinations thereof. The temperature of the molten salt bath typically is in a range from about 380° C. up to about 450° C., while immersion times range from about 15 minutes up to about 100 hours depending on glass sheet thickness, bath temperature and glass (or monovalent ion) diffusivity. However, temperatures and immersion times different from those described above may also be used.

In one or more embodiments, the glass sheets may be immersed in a molten salt bath of 100% $NaNO_3$, 100% $KNO_3$, or a combination of $NaNO_3$ and $KNO_3$ having a temperature from about 370° C. to about 480° C. In some embodiments, the glass sheet may be immersed in a molten mixed salt bath including from about 5% to about 90% $KNO_3$ and from about 10% to about 95% $NaNO_3$. In one or more embodiments, the glass sheet may be immersed in a second bath, after immersion in a first bath. The first and second baths may have different compositions and/or temperatures from one another. The immersion times in the first and second baths may vary. For example, immersion in the first bath may be longer than the immersion in the second bath.

In one or more embodiments, the glass sheet may be immersed in a molten, mixed salt bath including $NaNO_3$ and $KNO_3$ (e.g., 49%/51%, 50%/50%, 51%/49%) having a temperature less than about 420° C. (e.g., about 400° C. or about 380° C.). for less than about 5 hours, or even about 4 hours or less.

Ion exchange conditions can be tailored to provide a "spike" or to increase the slope of the stress profile at or near the surface of the resulting glass sheet. The spike may result in a greater surface CS value. This spike can be achieved by a single bath or multiple baths, with the bath(s) having a single composition or mixed composition, due to the unique properties of the glass compositions used in the glass sheets described herein.

In one or more embodiments, where more than one monovalent ion is exchanged into the glass sheet, the different monovalent ions may exchange to different depths within the glass sheet (and generate different magnitudes stresses within the glass sheet at different depths). The resulting relative depths of the stress-generating ions can be determined and cause different characteristics of the stress profile.

CS is measured using those means known in the art, such as by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured by those methods that are known in the art, such as fiber and four point bend methods, both of which are described in ASTM standard C770-98 (2013), entitled "Standard Test Method for Measurement of Glass Stress-Optical Coefficient," the contents of which are incorporated herein by reference in their entirety, and a bulk cylinder method. As used herein CS may be the "maximum compressive stress" which is the highest compressive stress value measured within the compressive stress layer. In some embodiments, the maximum compressive stress is located at the surface of the glass sheet. In other embodiments, the maximum compressive stress may occur at a depth below the surface, giving the compressive profile the appearance of a "buried peak."

DOC may be measured by FSM or by a scattered light polariscope (SCALP) (such as the SCALP-04 scattered light polariscope available from Glasstress Ltd., located in Tallinn Estonia), depending on the strengthening method and conditions. When the glass sheet is chemically strengthened by an ion exchange treatment, FSM or SCALP may be used depending on which ion is exchanged into the glass sheet. Where the stress in the glass sheet is generated by exchanging potassium ions into the glass sheet, FSM is used to measure DOC. Where the stress is generated by exchanging sodium ions into the glass sheet, SCALP is used to measure DOC. Where the stress in the glass sheet is generated by exchanging both potassium and sodium ions into the glass, the DOC is measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions in such glass sheets is measured by FSM. Central tension or CT is the maximum tensile stress and is measured by SCALP.

In one or more embodiments, the glass sheet may be strengthened to exhibit a DOC that is described as a fraction of the thickness T1 of the glass sheet (as described herein). For example, in one or more embodiments, the DOC may be equal to or greater than about 0.05T1, equal to or greater than about 0.1T1, equal to or greater than about 0.11T1, equal to or greater than about 0.12T1, equal to or greater than about 0.13T1, equal to or greater than about 0.14T1, equal to or greater than about 0.15T1, equal to or greater than about 0.16T1, equal to or greater than about 0.17T1, equal to or greater than about 0.18T1, equal to or greater than about 0.19T1, equal to or greater than about 0.2T1, equal to or greater than about 0.21T1. In some embodiments, the DOC may be in a range from about 0.08T1 to about 0.25T1, from about 0.09T1 to about 0.25T1, from about 0.18T1 to about 0.25T1, from about 0.11T1 to about 0.25T1, from about 0.12T1 to about 0.25T1, from about 0.13T1 to about 0.25T1, from about 0.14T1 to about 0.25T1, from about 0.15T1 to about 0.25T1, from about 0.08T1 to about 0.24T1, from about 0.08T1 to about 0.23T1, from about 0.08T1 to about 0.22T1, from about 0.08T1 to about 0.21T1, from about 0.08T1 to about 0.2T1, from about 0.08T1 to about 0.19T1, from about 0.08T1 to about 0.18T1, from about 0.08T1 to about 0.17T1, from about 0.08T1 to about 0.16T1, or from about 0.08T1 to about 0.15T1. In some instances, the DOC may be about 20 µm or less. In one or more embodiments, the DOC may be about 40 µm or greater (e.g., from about 40 µm to about 300 µm, from about 50 µm to about 300 µm, from about 60 µm to about 300 µm, from about 70 µm to about 300 µm, from about 80 µm to about 300 µm, from about 90 µm to about 300 µm, from about 100 µm to about 300 µm, from about 110 µm to about 300 µm, from about 120 µm to about 300 µm, from about 140 µm to about 300 µm, from about 150 µm to about 300 µm, from about 40 µm to about 290 µm, from about 40 µm to about 280 µm, from about 40 µm to about 260 µm, from about 40 µm to about 250 µm, from about 40 µm to about 240 µm, from about 40 µm to about 230 µm, from about 40 µm to about 220 µm, from about 40 µm to about 210 µm, from about 40 µm to about 200 µm, from about 40 µm to about 180 µm, from about 40 µm to about 160 µm, from about 40 µm to about 150 µm, from about 40 µm to about 140 µm, from about 40 µm to about 130 µm, from about 40 µm to about 120 µm, from about 40 µm to about 110 µm, or from about 40 µm to about 100 µm. In other embodiments, DOC falls within any one of the exact numerical ranges set forth in this paragraph.

In one or more embodiments, the strengthened glass sheet may have a CS (which may be found at the surface or a depth within the glass sheet) of about 200 MPa or greater, 300 MPa or greater, 400 MPa or greater, about 500 MPa or greater, about 600 MPa or greater, about 700 MPa or greater, about 800 MPa or greater, about 900 MPa or greater, about 930 MPa or greater, about 1000 MPa or greater, or about 1050 MPa or greater.

In one or more embodiments, the strengthened glass sheet may have a maximum tensile stress or central tension (CT) of about 20 MPa or greater, about 30 MPa or greater, about 40 MPa or greater, about 45 MPa or greater, about 50 MPa or greater, about 60 MPa or greater, about 70 MPa or greater, about 75 MPa or greater, about 80 MPa or greater, or about 85 MPa or greater. In some embodiments, the maximum tensile stress or central tension (CT) may be in a range from about 40 MPa to about 100 MPa. In other embodiments, CS falls within the exact numerical ranges set forth in this paragraph.

Glass Compositions

Suitable glass compositions for use in glass sheet 12 include soda lime glass, aluminosilicate glass, borosilicate glass, boroaluminosilicate glass, alkali-containing aluminosilicate glass, alkali-containing borosilicate glass, and alkali-containing boroaluminosilicate glass.

Unless otherwise specified, the glass compositions disclosed herein are described in mole percent (mol %) as analyzed on an oxide basis.

In one or more embodiments, the glass composition may include Sift in an amount in a range from about 66 mol % to about 80 mol %, from about 67 mol % to about 80 mol %, from about 68 mol % to about 80 mol %, from about 69 mol % to about 80 mol %, from about 70 mol % to about 80 mol %, from about 72 mol % to about 80 mol %, from about 65 mol % to about 78 mol %, from about 65 mol % to about 76 mol %, from about 65 mol % to about 75 mol %, from about 65 mol % to about 74 mol %, from about 65 mol % to about 72 mol %, or from about 65 mol % to about 70 mol %, and all ranges and sub-ranges therebetween.

In one or more embodiments, the glass composition includes $Al_2O_3$ in an amount greater than about 4 mol %, or greater than about 5 mol %. In one or more embodiments, the glass composition includes $Al_2O_3$ in a range from greater than about 7 mol % to about 15 mol %, from greater than about 7 mol % to about 14 mol %, from about 7 mol % to about 13 mol %, from about 4 mol % to about 12 mol %, from about 7 mol % to about 11 mol %, from about 8 mol % to about 15 mol %, from about 9 mol % to about 15 mol %, from about 10 mol % to about 15 mol %, from about 11 mol % to about 15 mol %, or from about 12 mol % to about 15 mol %, and all ranges and sub-ranges therebetween. In one or more embodiments, the upper limit of $Al_2O_3$ may be about 14 mol %, 14.2 mol %, 14.4 mol %, 14.6 mol %, or 14.8 mol %.

In one or more embodiments, the glass article is described as an aluminosilicate glass article or including an aluminosilicate glass composition. In such embodiments, the glass composition or article formed therefrom includes $SiO_2$ and $Al_2O_3$ and is not a soda lime silicate glass. In this regard, the glass composition or article formed therefrom includes $Al_2O_3$ in an amount of about 2 mol % or greater, 2.25 mol % or greater, 2.5 mol % or greater, about 2.75 mol % or greater, about 3 mol % or greater.

In one or more embodiments, the glass composition comprises $B_2O_3$ (e.g., about 0.01 mol % or greater). In one or more embodiments, the glass composition comprises $B_2O_3$ in an amount in a range from about 0 mol % to about 5 mol %, from about 0 mol % to about 4 mol %, from about 0 mol % to about 3 mol %, from about 0 mol % to about 2 mol %, from about 0 mol % to about 1 mol %, from about 0 mol % to about 0.5 mol %, from about 0.1 mol % to about 5 mol %, from about 0.1 mol % to about 4 mol %, from about 0.1 mol % to about 3 mol %, from about 0.1 mol % to about 2 mol %, from about 0.1 mol % to about 1 mol %, from about 0.1 mol % to about 0.5 mol %, and all ranges and sub-ranges therebetween. In one or more embodiments, the glass composition is substantially free of $B_2O_3$.

As used herein, the phrase "substantially free" with respect to the components of the composition means that the component is not actively or intentionally added to the composition during initial batching, but may be present as an impurity in an amount less than about 0.001 mol %.

In one or more embodiments, the glass composition optionally comprises $P_2O_5$ (e.g., about 0.01 mol % or greater). In one or more embodiments, the glass composition comprises a non-zero amount of $P_2O_5$ up to and including 2 mol %, 1.5 mol %, 1 mol %, or 0.5 mol %. In one or more embodiments, the glass composition is substantially free of $P_2O_5$.

In one or more embodiments, the glass composition may include a total amount of $R_2O$ (which is the total amount of alkali metal oxide such as $Li_2O$, $Na_2O$, $K_2O$, $Rb_2O$, and $Cs_2O$) that is greater than or equal to about 8 mol %, greater than or equal to about 10 mol %, or greater than or equal to about 12 mol %. In some embodiments, the glass composition includes a total amount of $R_2O$ in a range from about 8 mol % to about 20 mol %, from about 8 mol % to about 18 mol %, from about 8 mol % to about 16 mol %, from about 8 mol % to about 14 mol %, from about 8 mol % to about 12 mol %, from about 9 mol % to about 20 mol %, from about 10 mol % to about 20 mol %, from about 11 mol % to about 20 mol %, from about 12 mol % to about 20 mol %, from about 13 mol % to about 20 mol %, from about 10 mol % to about 14 mol %, or from 11 mol % to about 13 mol %, and all ranges and sub-ranges therebetween. In one or more embodiments, the glass composition may be substantially free of $Rb_2O$, $Cs_2O$ or both $Rb_2O$ and $Cs_2O$. In one or more embodiments, the $R_2O$ may include the total amount of $Li_2O$, $Na_2O$ and $K_2O$ only. In one or more embodiments, the glass composition may comprise at least one alkali metal oxide selected from $Li_2O$, $Na_2O$ and $K_2O$, wherein the alkali metal oxide is present in an amount greater than about 8 mol % or greater.

In one or more embodiments, the glass composition comprises $Na_2O$ in an amount greater than or equal to about 8 mol %, greater than or equal to about 10 mol %, or greater than or equal to about 12 mol %. In one or more embodiments, the composition includes $Na_2O$ in a range from about from about 8 mol % to about 20 mol %, from about 8 mol % to about 18 mol %, from about 8 mol % to about 16 mol %, from about 8 mol % to about 14 mol %, from about 8 mol % to about 12 mol %, from about 9 mol % to about 20 mol %, from about 10 mol % to about 20 mol %, from about 11 mol % to about 20 mol %, from about 12 mol % to about 20 mol %, from about 13 mol % to about 20 mol %, from about 10 mol % to about 14 mol %, or from 11 mol % to about 16 mol %, and all ranges and sub-ranges therebetween.

In one or more embodiments, the glass composition includes less than about 4 mol % $K_2O$, less than about 3 mol % $K_2O$, or less than about 1 mol % $K_2O$. In some instances, the glass composition may include $K_2O$ in an amount in a range from about 0 mol % to about 4 mol %, from about 0 mol % to about 3.5 mol %, from about 0 mol % to about 3 mol %, from about 0 mol % to about 2.5 mol %, from about 0 mol % to about 2 mol %, from about 0 mol % to about 1.5 mol %, from about 0 mol % to about 1 mol %, from about 0 mol % to about 0.5 mol %, from about 0 mol % to about 0.2 mol %, from about 0 mol % to about 0.1 mol %, from about 0.5 mol % to about 4 mol %, from about 0.5 mol % to about 3.5 mol %, from about 0.5 mol % to about 3 mol %, from about 0.5 mol % to about 2.5 mol %, from about 0.5 mol % to about 2 mol %, from about 0.5 mol % to about 1.5 mol %, or from about 0.5 mol % to about 1 mol %, and all ranges and sub-ranges therebetween. In one or more embodiments, the glass composition may be substantially free of $K_2O$.

In one or more embodiments, the glass composition is substantially free of $Li_2O$.

In one or more embodiments, the amount of $Na_2O$ in the composition may be greater than the amount of $Li_2O$. In some instances, the amount of $Na_2O$ may be greater than the combined amount of $Li_2O$ and $K_2O$. In one or more alternative embodiments, the amount of $Li_2O$ in the composition may be greater than the amount of $Na_2O$ or the combined amount of $Na_2O$ and $K_2O$.

In one or more embodiments, the glass composition may include a total amount of RO (which is the total amount of alkaline earth metal oxide such as CaO, MgO, BaO, ZnO and SrO) in a range from about 0 mol % to about 2 mol %. In some embodiments, the glass composition includes a non-zero amount of RO up to about 2 mol %. In one or more embodiments, the glass composition comprises RO in an amount from about 0 mol % to about 1.8 mol %, from about 0 mol % to about 1.6 mol %, from about 0 mol % to about 1.5 mol %, from about 0 mol % to about 1.4 mol %, from about 0 mol % to about 1.2 mol %, from about 0 mol % to about 1 mol %, from about 0 mol % to about 0.8 mol %, from about 0 mol % to about 0.5 mol %, and all ranges and sub-ranges therebetween.

In one or more embodiments, the glass composition includes CaO in an amount less than about 1 mol %, less than about 0.8 mol %, or less than about 0.5 mol %. In one or more embodiments, the glass composition is substantially free of CaO.

In some embodiments, the glass composition comprises MgO in an amount from about 0 mol % to about 7 mol %, from about 0 mol % to about 6 mol %, from about 0 mol % to about 5 mol %, from about 0 mol % to about 4 mol %, from about 0.1 mol % to about 7 mol %, from about 0.1 mol % to about 6 mol %, from about 0.1 mol % to about 5 mol %, from about 0.1 mol % to about 4 mol %, from about 1 mol % to about 7 mol %, from about 2 mol % to about 6 mol %, or from about 3 mol % to about 6 mol %, and all ranges and sub-ranges therebetween.

In one or more embodiments, the glass composition comprises $ZrO_2$ in an amount equal to or less than about 0.2 mol %, less than about 0.18 mol %, less than about 0.16 mol %, less than about 0.15 mol %, less than about 0.14 mol %, less than about 0.12 mol %. In one or more embodiments, the glass composition comprises $ZrO_2$ in a range from about 0.01 mol % to about 0.2 mol %, from about 0.01 mol % to about 0.18 mol %, from about 0.01 mol % to about 0.16 mol %, from about 0.01 mol % to about 0.15 mol %, from about 0.01 mol % to about 0.14 mol %, from about 0.01 mol % to about 0.12 mol %, or from about 0.01 mol % to about 0.10 mol %, and all ranges and sub-ranges therebetween.

In one or more embodiments, the glass composition comprises $SnO_2$ in an amount equal to or less than about 0.2 mol %, less than about 0.18 mol %, less than about 0.16 mol %, less than about 0.15 mol %, less than about 0.14 mol %, less than about 0.12 mol %. In one or more embodiments, the glass composition comprises $SnO_2$ in a range from about 0.01 mol % to about 0.2 mol %, from about 0.01 mol % to about 0.18 mol %, from about 0.01 mol % to about 0.16 mol %, from about 0.01 mol % to about 0.15 mol %, from about 0.01 mol % to about 0.14 mol %, from about 0.01 mol % to about 0.12 mol %, or from about 0.01 mol % to about 0.10 mol %, and all ranges and sub-ranges therebetween.

In one or more embodiments, the glass composition may include an oxide that imparts a color or tint to the glass articles. In some embodiments, the glass composition includes an oxide that prevents discoloration of the glass article when the glass article is exposed to ultraviolet radiation. Examples of such oxides include, without limitation oxides of: Ti, V, Cr, Mn, Fe, Co, Ni, Cu, Ce, W, and Mo.

In one or more embodiments, the glass composition includes Fe expressed as $Fe_2O_3$, wherein Fe is present in an amount up to (and including) about 1 mol %. In some embodiments, the glass composition is substantially free of Fe. In one or more embodiments, the glass composition comprises $Fe_2O_3$ in an amount equal to or less than about 0.2 mol %, less than about 0.18 mol %, less than about 0.16 mol %, less than about 0.15 mol %, less than about 0.14 mol %, less than about 0.12 mol %. In one or more embodiments, the glass composition comprises $Fe_2O_3$ in a range from about 0.01 mol % to about 0.2 mol %, from about 0.01 mol % to about 0.18 mol %, from about 0.01 mol % to about 0.16 mol %, from about 0.01 mol % to about 0.15 mol %, from about 0.01 mol % to about 0.14 mol %, from about 0.01 mol % to about 0.12 mol %, or from about 0.01 mol % to about 0.10 mol %, and all ranges and sub-ranges therebetween.

Where the glass composition includes $TiO_2$, $TiO_2$ may be present in an amount of about 5 mol % or less, about 2.5 mol % or less, about 2 mol % or less or about 1 mol % or less. In one or more embodiments, the glass composition may be substantially free of $TiO_2$.

An exemplary glass composition includes $SiO_2$ in an amount in a range from about 65 mol % to about 75 mol %, $Al_2O_3$ in an amount in a range from about 8 mol % to about 14 mol %, $Na_2O$ in an amount in a range from about 12 mol % to about 17 mol %, $K_2O$ in an amount in a range of about 0 mol % to about 0.2 mol %, and MgO in an amount in a range from about 1.5 mol % to about 6 mol %. Optionally, $SnO_2$ may be included in the amounts otherwise disclosed herein. It should be understood, that while the preceding glass composition paragraphs express approximate ranges, in other embodiments, glass sheet 12 may be made from any glass composition falling with any one of the exact numerical ranges discussed above.

Aspect (1) of this disclosure pertains to a curved display assembly, comprising: a glass sheet having a first major surface and a second major surface opposite to the first major surface, the glass sheet having a first thickness measured between the first major surface and the second major surface, wherein the second major surface defines a first radius of curvature of the glass sheet and wherein the first radius of curvature has a bend axis; a curved display having a second thickness between a first display surface and a second display surface, the display comprising a display region and two overhanging edges that are adjacent to the display region and parallel to the bend axis; a first adhesive bonding the second display surface of the curved display to the second major surface of the glass sheet in the display region; and a second adhesive bonds each of the two overhanging edges to the second major surface of the glass sheet, the second adhesive having a higher elastic modulus than the first adhesive; wherein the overhanging edges each extend a distance outside of the display area that is at least three times the second thickness of the curved display.

Aspect (2) pertains to the curved display assembly of Aspect (1), wherein the curved display is at least one of a liquid crystal display (LCD), a light emitting diode (LED)

display, an organic LED (OLED) display, a quantum dot LED (QLED) display, or a plasma display.

Aspect (3) pertains to the curved display assembly of Aspect (1) or Aspect (2), further comprising a backlight disposed on the second display surface such that the curved display is arranged between the backlight and the glass sheet.

Aspect (4) pertains to the curved display assembly of any one of Aspects (1) through (3), further comprising a frame, wherein the frame is bonded to the second major surface of the glass sheet around the curved display.

Aspect (5) pertains to the curved display assembly of any one of Aspects (1) through (4), wherein the curved display is an LCD comprising a first polarizer defining the first display surface, a thin-film-transistor (TFT) substrate disposed on the first polarizer, a liquid crystal layer disposed on the TFT substrate, a color filter (CF) substrate disposed on the liquid crystal layer, and a second polarizer disposed on the CF substrate, the second polarizer defining the second display surface.

Aspect (6) pertains to the curved display assembly of Aspect (5), wherein the TFT substrate comprises the two overhanging edges.

Aspect (7) pertains to the curved display assembly of any one of Aspects (1) through (3), 7. The curved display assembly of Aspect (5) or Aspect (6), wherein the TFT substrate and the CF substrate each comprise a glass material.

Aspect (8) pertains to the curved display assembly of any one of Aspects (1) through (7), wherein the elastic modulus of the second adhesive is at least 0.5 MPa.

Aspect (9) pertains to the curved display assembly of any one of Aspects (1) through (8), wherein the elastic modulus of the first adhesive is from 10 kPa to 100 kPa.

Aspect (10) pertains to the curved display assembly of any one of Aspects (1) through (9), wherein the display region has a light leakage fraction of no more than $1 \times 10^{-4}$.

Aspect (11) pertains to the curved display assembly of any one of Aspects (1) through (10), wherein the glass sheet comprises at least one of a soda lime silicate glass, an aluminosilicate glass, a borosilicate glass, an aluminoborosilicate glass, or an alkali aluminosilicate glass.

Aspect (12) pertains to the curved display assembly of any one of Aspects (1) through (11), wherein the glass sheet comprises a thickness between the first major surface and the second major surface that is at most 2 mm.

Aspect (13) pertains to the curved display assembly of any one of Aspects (1) through (12), wherein the first radius of curvature is from 30 mm to 5 m.

Aspect (14) pertains to a vehicle interior system, comprising the curved display assembly according to any one of Aspects (1) through (13), wherein the vehicle interior system is at least one of a center console, an instrument panel, or a dashboard.

Aspect (15) pertains to a vehicle, comprising the vehicle interior system of Aspect (14).

Aspect (16) pertains to the vehicle of Aspect (15), wherein the vehicle is an automobile, an aircraft, a seacraft, or a train.

Aspect (17) pertains to a method of forming a curved glass article comprising the steps of: providing a glass sheet comprising a first major surface and a second major surface, the second major surface being opposite to the first major surface; bonding a display to the second major surface of the glass sheet, the display comprising a display region and two overhanging edges adjacent to the display region, wherein the display region is bonded to the second major surface of the glass sheet using a first adhesive and the two overhanging edges are bonded to the second major surface of the glass sheet using a second adhesive, the second adhesive having a higher modulus than the first adhesive; bending the glass sheet and display at a temperature less than a glass transition temperature of the glass sheet to form a curvature having a bending axis in the glass sheet and display; wherein the two overhanging edges are parallel to the bending axis; and wherein each of the two overhanging edges extend beyond the display region at least a distance that is three times a thickness of the display.

Aspect (18) pertains to a method of forming a curved glass article comprising the steps of: providing a curved glass sheet comprising a first major surface and a second major surface, the second major surface being opposite to the first major surface and the second major surface defining a curvature having a bending axis; bending a display over the curvature of the glass sheet, the display comprising a display region and two overhanging edges adjacent to the display region and parallel to the bending axis; and bonding the display to the second major surface of the glass sheet, wherein the display region is bonded to the second major surface of the glass sheet using a first adhesive and the two overhanging edges are bonded to the second major surface of the glass sheet using a second adhesive, the second adhesive having a higher modulus than the first adhesive; wherein each of the two overhanging edges extend beyond the display region at least a distance that is three times a thickness of the display.

Aspect (19) pertains to the method of Aspect (18), wherein the step of providing a curved glass sheet comprises hot forming a flat glass sheet to introduce a permanent curvature into the flat glass sheet.

Aspect (20) pertains to the method of Aspect (18), wherein the step of providing the curved glass sheet comprises cold forming a flat glass sheet by bending the flat glass sheet over a chuck at a temperature less than the glass transition temperature of the flat glass sheet.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred. In addition, as used herein, the article "a" is intended to include one or more than one component or element, and is not intended to be construed as meaning only one.

It will be apparent to those skilled in the art that various modifications and variations can be made without departing from the spirit or scope of the disclosed embodiments. Since modifications, combinations, sub-combinations and variations of the disclosed embodiments incorporating the spirit and substance of the embodiments may occur to persons skilled in the art, the disclosed embodiments should be construed to include everything within the scope of the appended claims and their equivalents.

What is claimed is:
1. A curved display assembly, comprising:
 a glass sheet having a first major surface and a second major surface opposite to the first major surface, the glass sheet having a first thickness measured between the first major surface and the second major surface, wherein the second major surface defines a first radius of curvature of the glass sheet and wherein the first radius of curvature has a bend axis;

a curved display having a second thickness between a first display surface and a second display surface, the display comprising a display region and two overhanging edges that are adjacent to the display region and parallel to the bend axis, wherein the two overhanging edges are disposed on opposite sides of the bend axis;

a first adhesive bonding the second display surface of the curved display to the second major surface of the glass sheet in the display region; and a second adhesive bonds each of the two overhanging edges to the second major surface of the glass sheet, the second adhesive having a higher elastic modulus than the first adhesive;

wherein the overhanging edges each extend a distance outside of the display area that is at least three times the second thickness of the curved display, wherein the curved display is a liquid crystal display (LCD) comprising a first polarizer defining the first display surface, a thin-film-transistor (TFT) substrate disposed on the first polarizer, a liquid crystal layer disposed on the TFT substrate, a color filter (CF) substrate disposed on the liquid crystal layer, and a second polarizer disposed on the CF substrate, the second polarizer defining the second display surface, wherein the TFT substrate extends outward of peripheral edges of the CF substrate to form the overhanging edges, and wherein the first radius of curvature is from 30 mm to 5 m, wherein the curved display comprises a cylindrical shape and the second adhesive applies a bending moment along the overhanging edges to maintain the cylindrical shape.

2. The curved display assembly of claim 1, further comprising a backlight disposed on the second display surface such that the curved display is arranged between the backlight and the glass sheet.

3. The curved display assembly of claim 1, further comprising a frame, wherein the frame is bonded to the second major surface of the glass sheet around the curved display.

4. The curved display assembly of claim 1, wherein the TFT substrate is bonded to the glass sheet via the second adhesive at the overhanging edges and the second polarizer is bonded to the glass sheet via the first adhesive.

5. The curved display assembly of claim 1, wherein the elastic modulus of the second adhesive is at least 0.5 MPa.

6. The curved display assembly of claim 5, wherein the elastic modulus of the first adhesive is from 10 kPa to 100 kPa.

7. The curved display assembly of claim 1, wherein the display region has a light leakage fraction of no more than $1\times10^{-4}$.

8. The curved display assembly of claim 1, wherein the glass sheet comprises at least one of a soda lime silicate glass, an aluminosilicate glass, a borosilicate glass, an aluminoborosilicate glass, or an alkali aluminosilicate glass.

9. The curved display assembly of claim 1, wherein the glass sheet comprises a thickness between the first major surface and the second major surface that is at most 2 mm.

10. The curved display assembly of claim 1, further comprising a frame that is bonded to the second major surface of the glass sheet around the curved display via a third adhesive.

11. The curved display assembly of claim 10, wherein:
the first adhesive comprises an elastic modulus that is greater than or equal to 10 kPa and less than or equal to 100 kPa;
the second adhesive comprises an elastic modulus that is greater than or equal to 0.5 MPa and less than or equal to 20 MPa; and
the third adhesive comprises an elastic modulus of greater than or equal to 2.0 MPa and less than or equal to 20 MPa.

12. The curved display assembly of claim 10, wherein the frame comprises a cylindrical shape and the glass sheet is attached to the frame after being cold-formed.

13. The curved display assembly of claim 1, wherein:
the elastic modulus of the second adhesive is at least 0.5 Mpa,
the elastic modulus of the first adhesive is from 10 kPa to 100 kPa, and
the display region has a light leakage fraction of no more than $1\times10^{-4}$.

14. A method of forming a curved glass article comprising the steps of:
providing a curved glass sheet comprising a first major surface and a second major surface, the second major surface being opposite to the first major surface and the second major surface defining a curvature having a bending axis;
bending a display over the curvature of the curved glass sheet, the display comprising a display region and two overhanging edges adjacent to the display region and parallel to the bending axis; and
bonding the display to the second major surface of the curved glass sheet, wherein the display region is bonded to the second major surface of the curved glass sheet using a first adhesive and the two overhanging edges are bonded to the second major surface of the curved glass sheet using a second adhesive, the second adhesive having a higher modulus than the first adhesive;
wherein each of the two overhanging edges extend beyond the display region at least a distance that is three times a thickness of the display,
wherein the two overhanging edges are disposed on opposite sides of the bend axis,
wherein the display is a liquid crystal display (LCD) comprising a first polarizer defining the first display surface, a thin-film-transistor (TFT) substrate disposed on the first polarizer, a liquid crystal layer disposed on the TFT substrate, a color filter (CF) substrate disposed on the liquid crystal layer, and a second polarizer disposed on the CF substrate, the second polarizer defining the second display surface, and
wherein the TFT substrate extends outward of peripheral edges of the CF substrate to form the overhanging edges,
wherein the TFT substrate is bonded to the curved glass sheet via the second adhesive at the overhanging edges and the second polarizer is bonded to the glass sheet via the first adhesive.

15. The method of claim 14, wherein the step of providing a curved glass sheet comprises hot forming a flat glass sheet to introduce a permanent curvature into the flat glass sheet.

16. The method of claim 14, wherein the step of providing the curved glass sheet comprises cold forming a flat glass sheet by bending the flat glass sheet over a chuck at a temperature less than the glass transition temperature of the flat glass sheet.

17. A curved display assembly, comprising:
a glass sheet having a first major surface and a second major surface opposite to the first major surface, the glass sheet having a first thickness measured between the first major surface and the second major surface, wherein the second major surface defines a first radius of curvature of the glass sheet and wherein the first radius of curvature has a bend axis;

a curved display having a second thickness between a first display surface and a second display surface, the display comprising a display region and two overhanging edges that are adjacent to the display region and parallel to the bend axis, wherein the two overhanging edges are disposed on opposite sides of the bend axis;

a first adhesive bonding the second display surface of the curved display to the second major surface of the glass sheet in the display region; and a second adhesive bonds each of the two overhanging edges to the second major surface of the glass sheet, the second adhesive having a higher elastic modulus than the first adhesive;

wherein the overhanging edges each extend a distance outside of the display area that is at least three times the second thickness of the curved display, wherein the curved display is a liquid crystal display (LCD) comprising a first polarizer defining the first display surface, a thin-film-transistor (TFT) substrate disposed on the first polarizer, a liquid crystal layer disposed on the TFT substrate, a color filter (CF) substrate disposed on the liquid crystal layer, and a second polarizer disposed on the CF substrate, the second polarizer defining the second display surface, wherein the TFT substrate extends outward of peripheral edges of the CF substrate to form the overhanging edges, and wherein the TFT substrate is bonded to the glass sheet via the second adhesive at the overhanging edges and the second polarizer is bonded to the glass sheet via the first adhesive.

* * * * *